US012125920B2

(12) United States Patent
Li et al.

(10) Patent No.: US 12,125,920 B2
(45) Date of Patent: Oct. 22, 2024

(54) DUAL-LAYER CHANNEL TRANSISTOR AND METHODS OF FORMING SAME

(71) Applicant: Taiwan Semiconductor Manufacturing Company Limited, Hsinchu (TW)

(72) Inventors: Hung Wei Li, Hsinchu (TW); Yu-Ming Lin, Hsinchu (TW); Mauricio Manfrini, Zhubei (TW); Kuo-Chang Chiang, Hsinchu (TW); Sai-Hooi Yeong, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/191,567

(22) Filed: Mar. 28, 2023

(65) Prior Publication Data
US 2023/0238462 A1    Jul. 27, 2023

Related U.S. Application Data

(63) Continuation of application No. 17/228,392, filed on Apr. 12, 2021, now Pat. No. 11,646,379.
(Continued)

(51) Int. Cl.
H01L 29/66    (2006.01)
H01L 29/10    (2006.01)
H01L 29/786    (2006.01)

(52) U.S. Cl.
CPC .... H01L 29/78696 (2013.01); H01L 29/1054 (2013.01); H01L 29/66765 (2013.01);
(Continued)

(58) Field of Classification Search
CPC ............. H01L 29/78696; H01L 29/786; H01L 29/1054; H01L 29/10; H01L 29/66765;
(Continued)

(56) References Cited

U.S. PATENT DOCUMENTS 10,680,114 B2    6/2020    Kang et al.
10,866,475 B2 *  12/2020   Saitoh ................. G02F 1/13624
(Continued)

FOREIGN PATENT DOCUMENTS

CN    102709325 A    10/2012
CN    102709326 A    10/2012
(Continued)

OTHER PUBLICATIONS

Korean Patent and Trademark Office, Application No. 10-2021-0075502 Office Action, mailed Aug. 10, 2022 5 pages.
Taiwan Patent and Trademark Office, Application No. 110121064 Office Action, mailed Apr. 22, 2022 5 pages.
(Continued)

*Primary Examiner* — Nikolay K Yushin
(74) *Attorney, Agent, or Firm* — The Marbury Law Group, PLLC

(57) ABSTRACT

A transistor device and method of making the same, the transistor device including: a substrate; a word line disposed on the substrate; a gate insulating layer disposed on the word line; a dual-layer semiconductor channel including: a first channel layer disposed on the gate insulating layer; and a second channel layer disposed on the first channel layer, such that the second channel layer contacts side and top surfaces of the first channel layer; and source and drain electrodes electrically coupled to the second channel layer. When a voltage is applied to the word line, the first channel
(Continued)

layer has a first electrical resistance and the second channel layer has a second electrical resistance that is different from the first electrical resistance.

20 Claims, 18 Drawing Sheets

Related U.S. Application Data

(60) Provisional application No. 63/042,581, filed on Jun. 23, 2020.

(52) U.S. Cl.
CPC .......... *H01L 29/66969* (2013.01); *H01L 29/78669* (2013.01); *H01L 29/78678* (2013.01); *H01L 29/7869* (2013.01)

(58) Field of Classification Search
CPC .......... H01L 29/66; H01L 29/66969; H01L 29/78669; H01L 29/78678; H01L 29/7869; H01L 29/1033; H01L 29/42376; H01L 29/7838; H01L 29/66742; H10B 51/10; H10B 51/30; H10B 51/40; H10B 61/22; H10B 61/00; H10B 63/30; H10B 63/80; H10B 63/00; H10B 63/34; H10B 63/84

See application file for complete search history.

(56) References Cited

U.S. PATENT DOCUMENTS

2016/0380113 A1    12/2016  Kang et al.
2020/0124899 A1*    4/2020  Saitoh ................ G02F 1/13624

FOREIGN PATENT DOCUMENTS

| CN | 107408578 A   | 11/2017 |
| CN | 109979945 A   | 7/2019  |
| JP | 2011-243745 A | 12/2011 |
| KR | 20020076934 A | 10/2002 |
| KR | 20140107127 A | 9/2014  |
| KR | 20150015383 A | 2/2015  |
| TW | 201140759 A   | 11/2011 |

OTHER PUBLICATIONS

Taiwan Patent and Trademark Office (Jianq Chyun Intellectual Property Office), Application No. 110121064, Office Action, mailed Sep. 7, 2023, 13 pages.

* cited by examiner

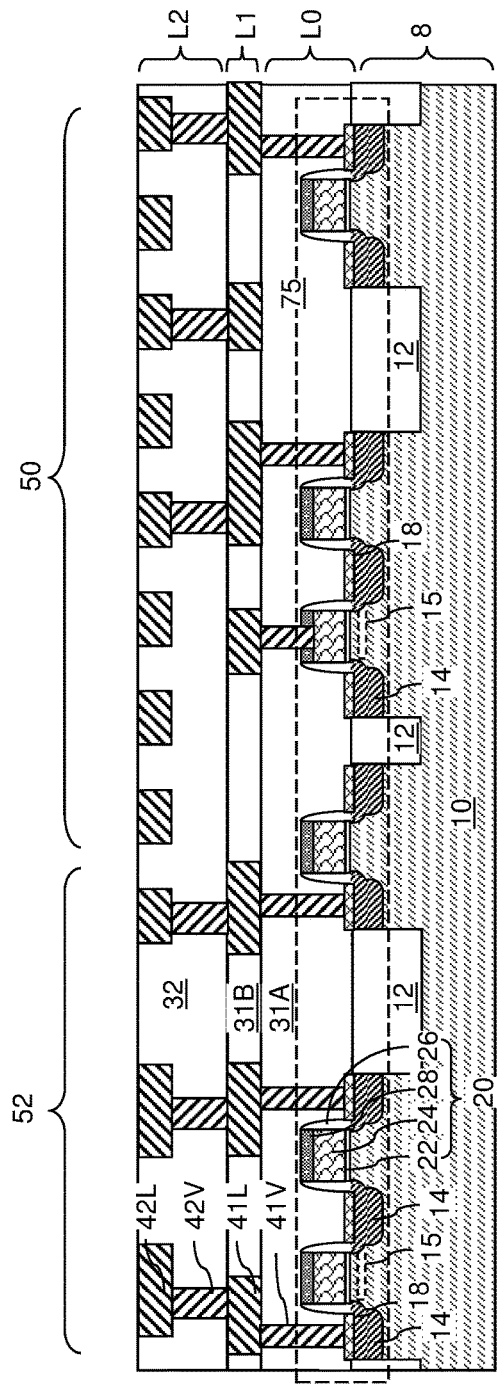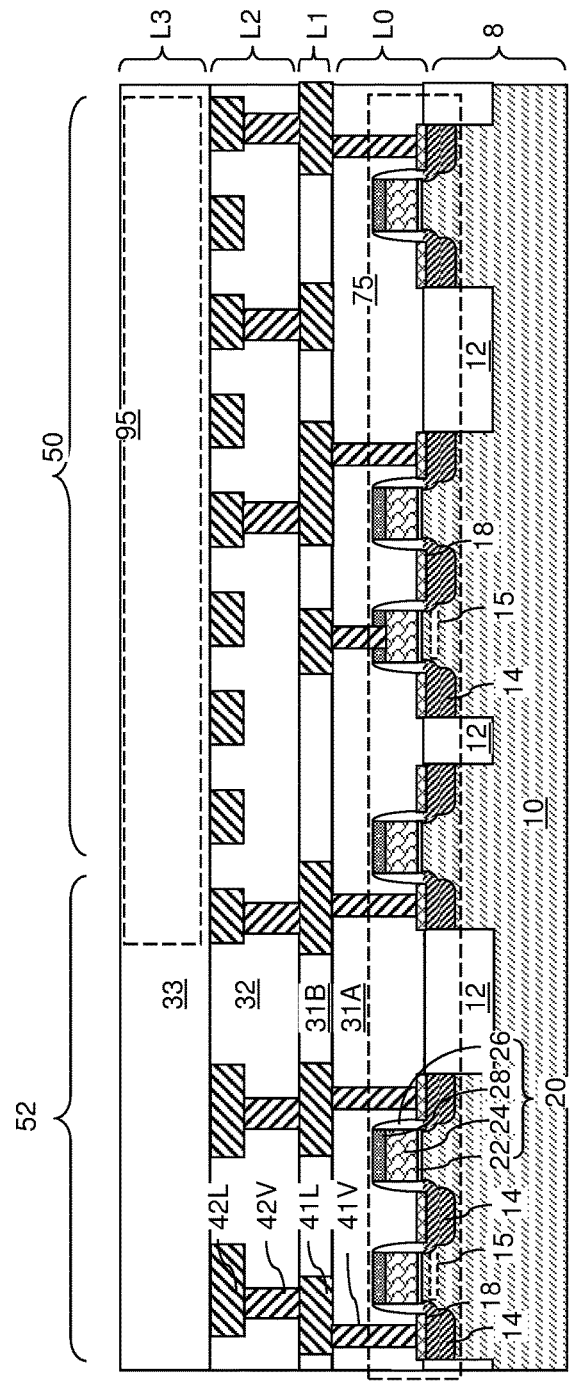
FIG. 1A
FIG. 1B

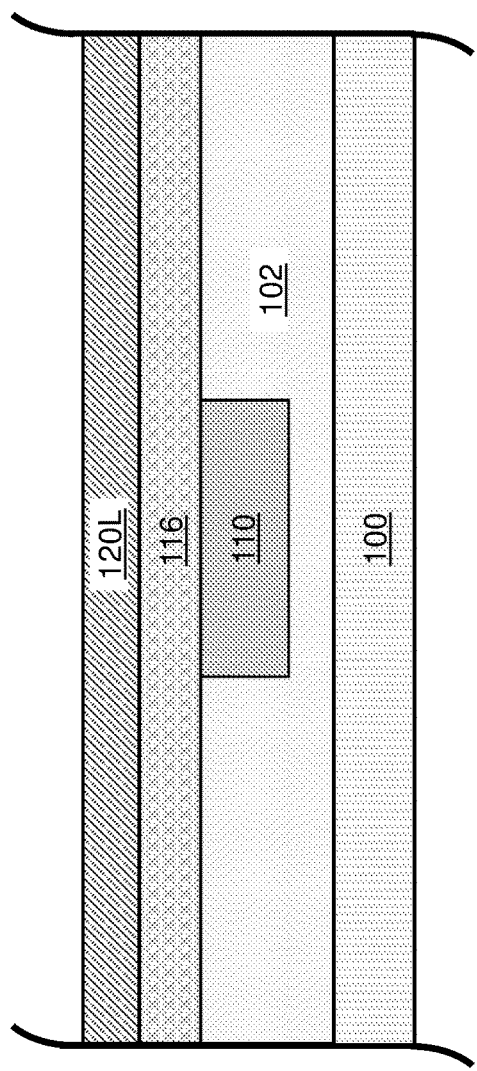
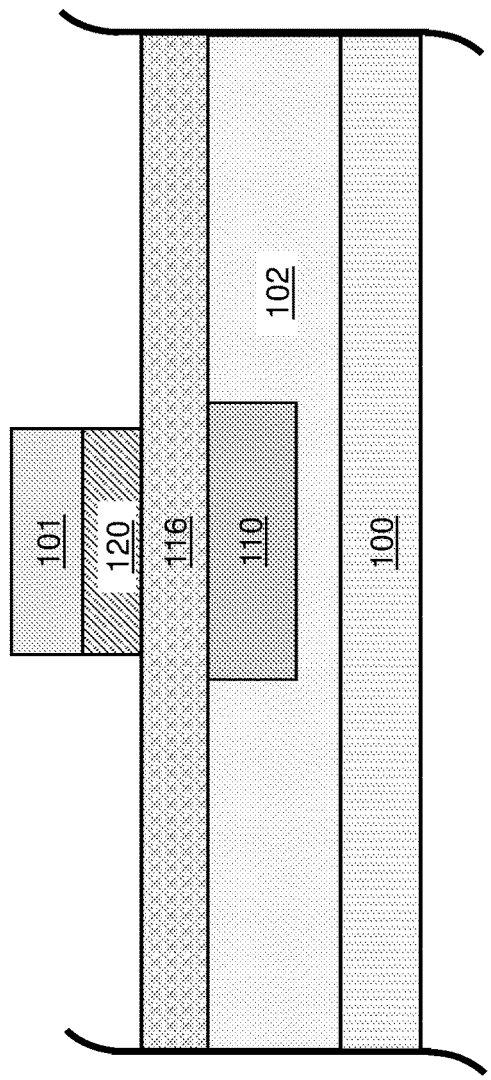

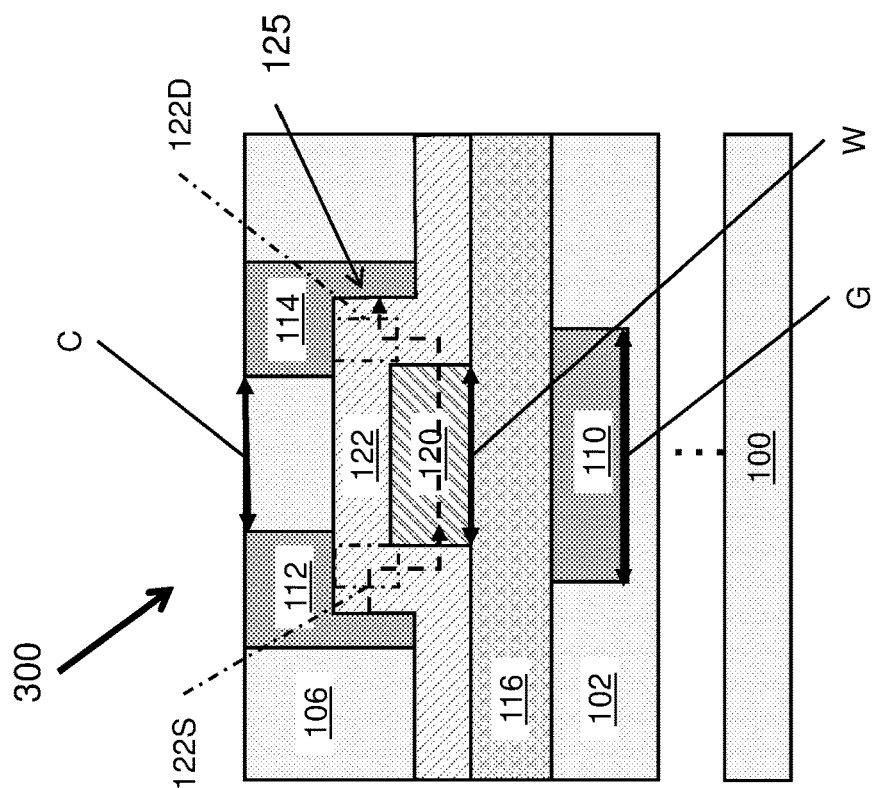
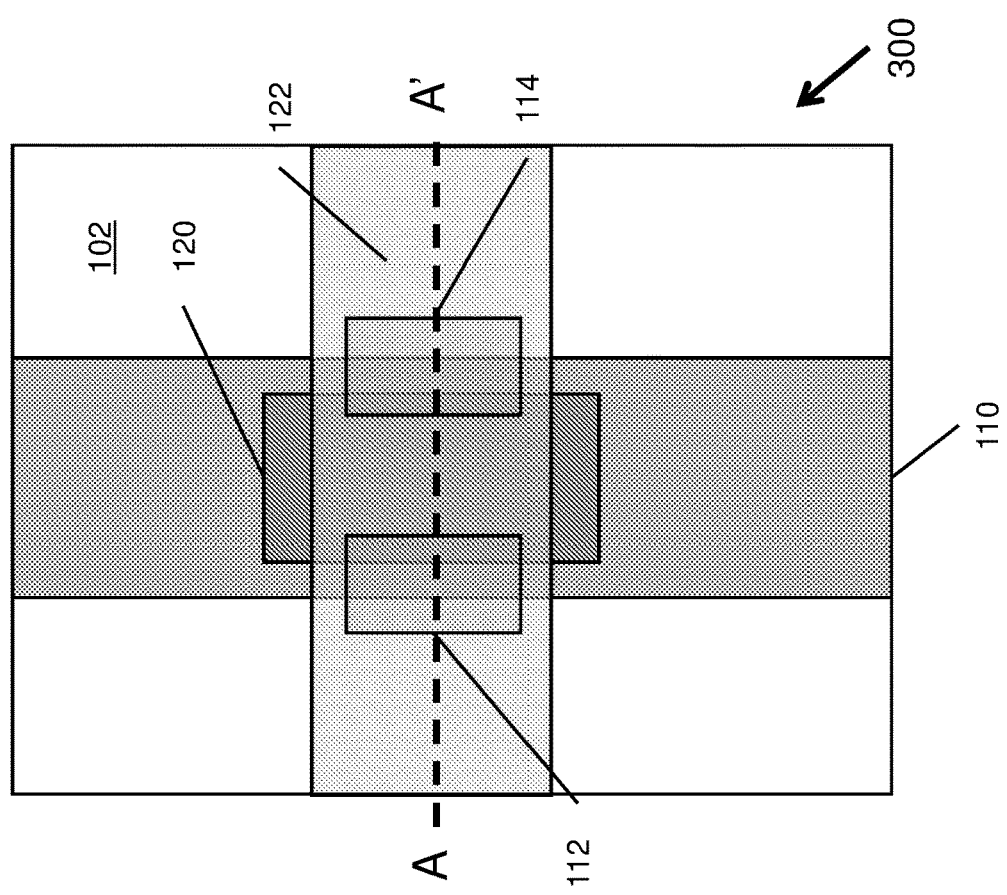
FIG. 3B
FIG. 3A

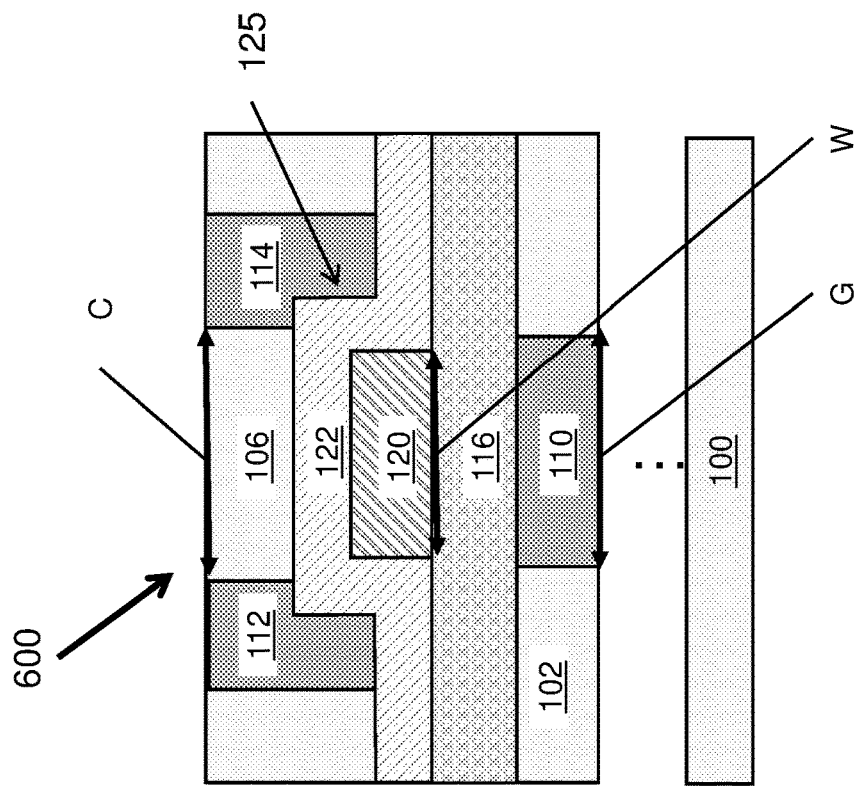
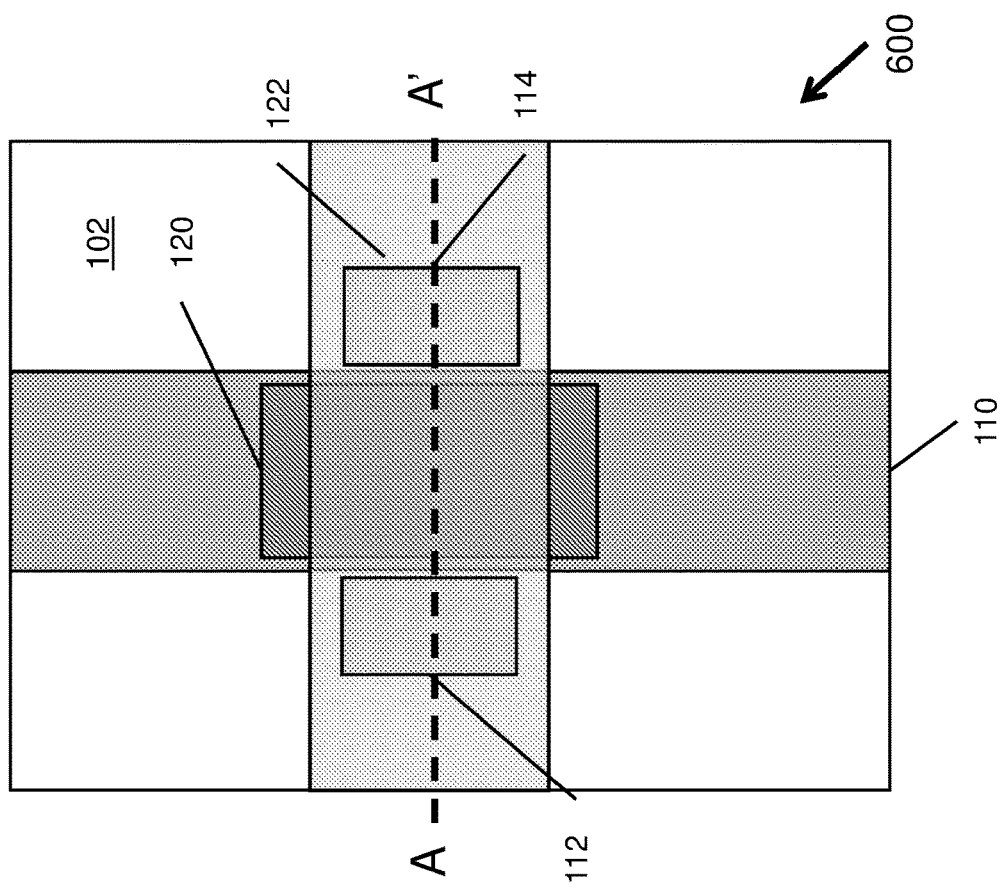
FIG. 6B
FIG. 6A

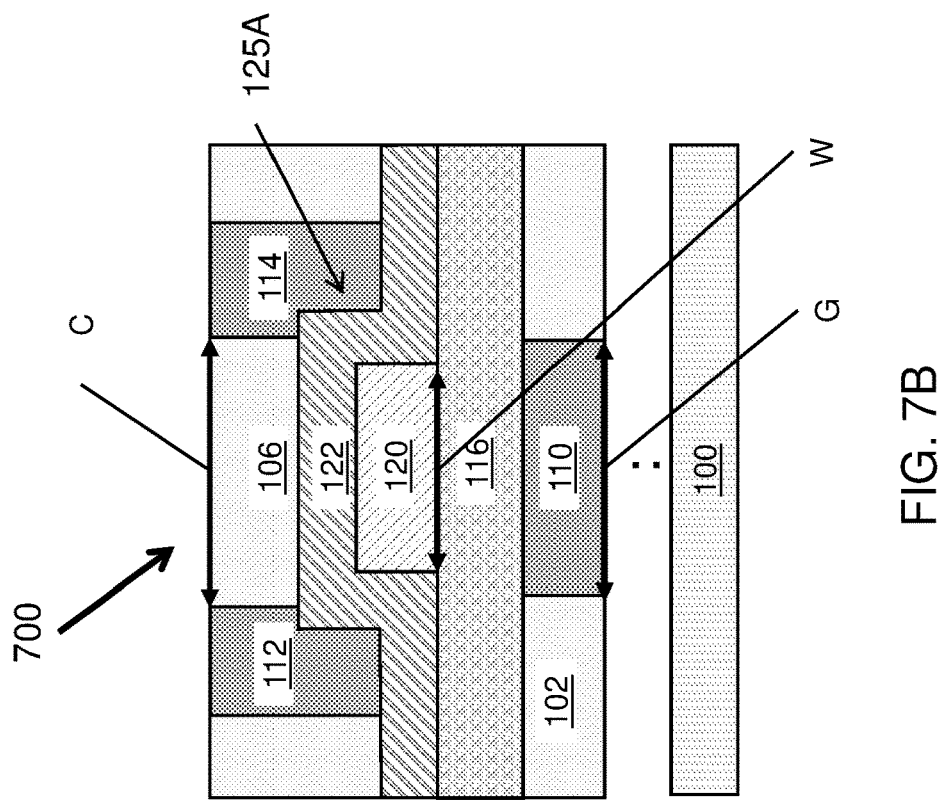
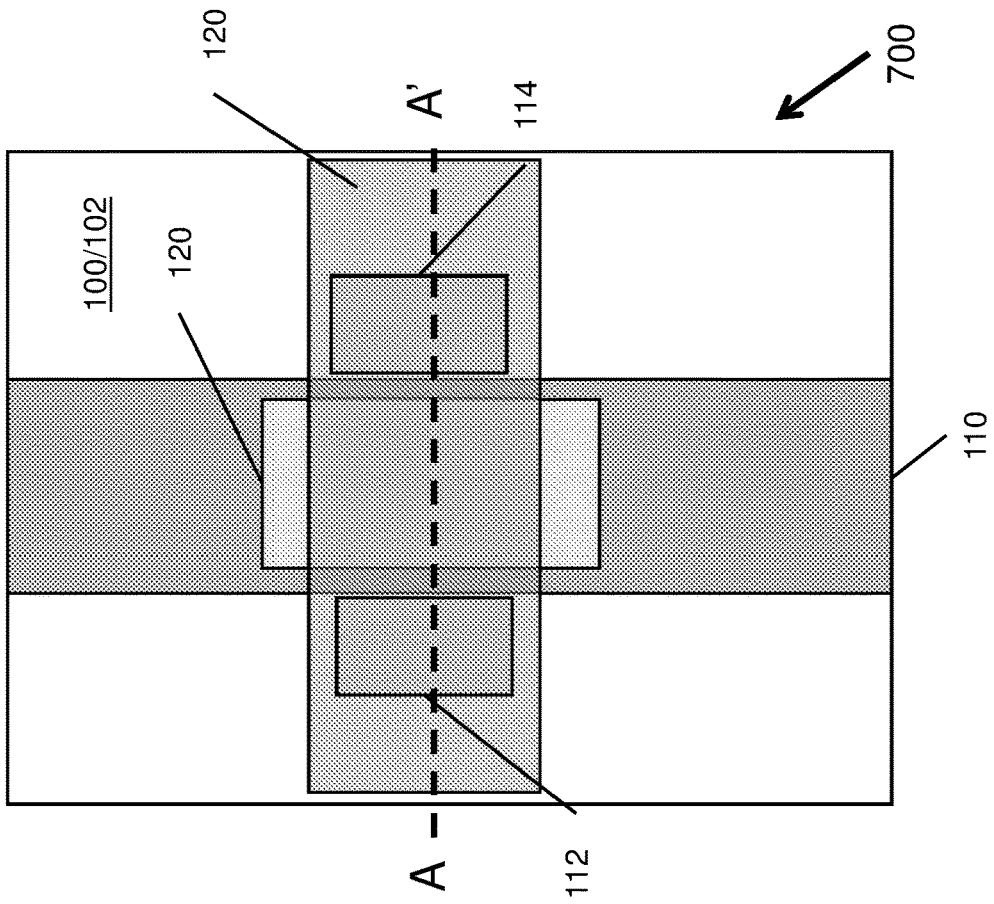
FIG. 7A
FIG. 7B

DUAL-LAYER CHANNEL TRANSISTOR AND METHODS OF FORMING SAME

RELATED APPLICATIONS

This application is a continuation of U.S. patent application Ser. No. 17/288,392 entitled "Dual-Layer Channel Transistor and Methods of Forming Same," filed on Apr. 12, 2021, which claims priority to U.S. Provisional Patent Application No. 63/042,581 entitled "Formation of multi GX FET," filed on Jun. 23, 2020, the entire contents of both of which are hereby incorporated by reference for all purposes.

BACKGROUND

In the semiconductor industry, there is constant desire to increase the areal density of integrated circuits. To do so, individual transistors have become increasingly smaller. However, the rate at which individual transistors may be made smaller is slowing. Moving peripheral transistors from the front-end-of-line (FEOL) to the back-end-of Line (BEOL) of fabrication may be advantageous because functionality may be added at the BEOL while valuable chip area may be made available in the FEOL. Transistors that use oxide semiconductors are an attractive option for BEOL integration because such transistors may be processed at low temperatures and thus, will not damage previously fabricated devices. For example, thin-film transistors (TFTs) often use oxide semiconductor materials.

Various memory cell elements (e.g., magneto-resistive random-access memory (MRAM), resistive random-access memory (RRAM or ReRAM)) may utilize a transistor to select or energize the memory cell. However, CMOS transistors used as select transistor may limit the device density of memory cell elements as the size of CMOS transistors may be limiting.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of a first exemplary structure prior to formation of an array of transistors according to an embodiment of the present disclosure.

FIG. 1B is a vertical cross-sectional view of the first exemplary structure during formation of the array of transistors according to an embodiment of the present disclosure.

FIG. 2D is a vertical cross-sectional view illustrating an intermediate structure of an embodiment transistor after the deposition of gate dielectric layer and a first channel material over the word line and first dielectric layer.

FIG. 2E is a vertical cross-sectional view illustrating an intermediate structure of an embodiment transistor after the patterning of the first channel material to form a first channel layer.

FIG. 3A is top semi-transparent view of a transistor, according to a first embodiment of the present disclosure.

FIG. 3B is a vertical cross-sectional view of a transistor taken along line A-A' of FIG. 3A according to various embodiments of the present disclosure.

FIG. 6A is top semi-transparent view of a transistor 600, according to various embodiments of the present disclosure.

FIG. 6B is a vertical cross-sectional view of a transistor taken along line A-A' of FIG. 6A, according to various embodiments of the present disclosure.

FIG. 7A is top semi-transparent view of a transistor 700, according to various embodiments of the present disclosure.

FIG. 7B is a vertical cross-sectional view of a transistor taken along line A-A' of FIG. 7A, according to various embodiments of the present disclosure.

DETAILED DESCRIPTION

Figure 1C:
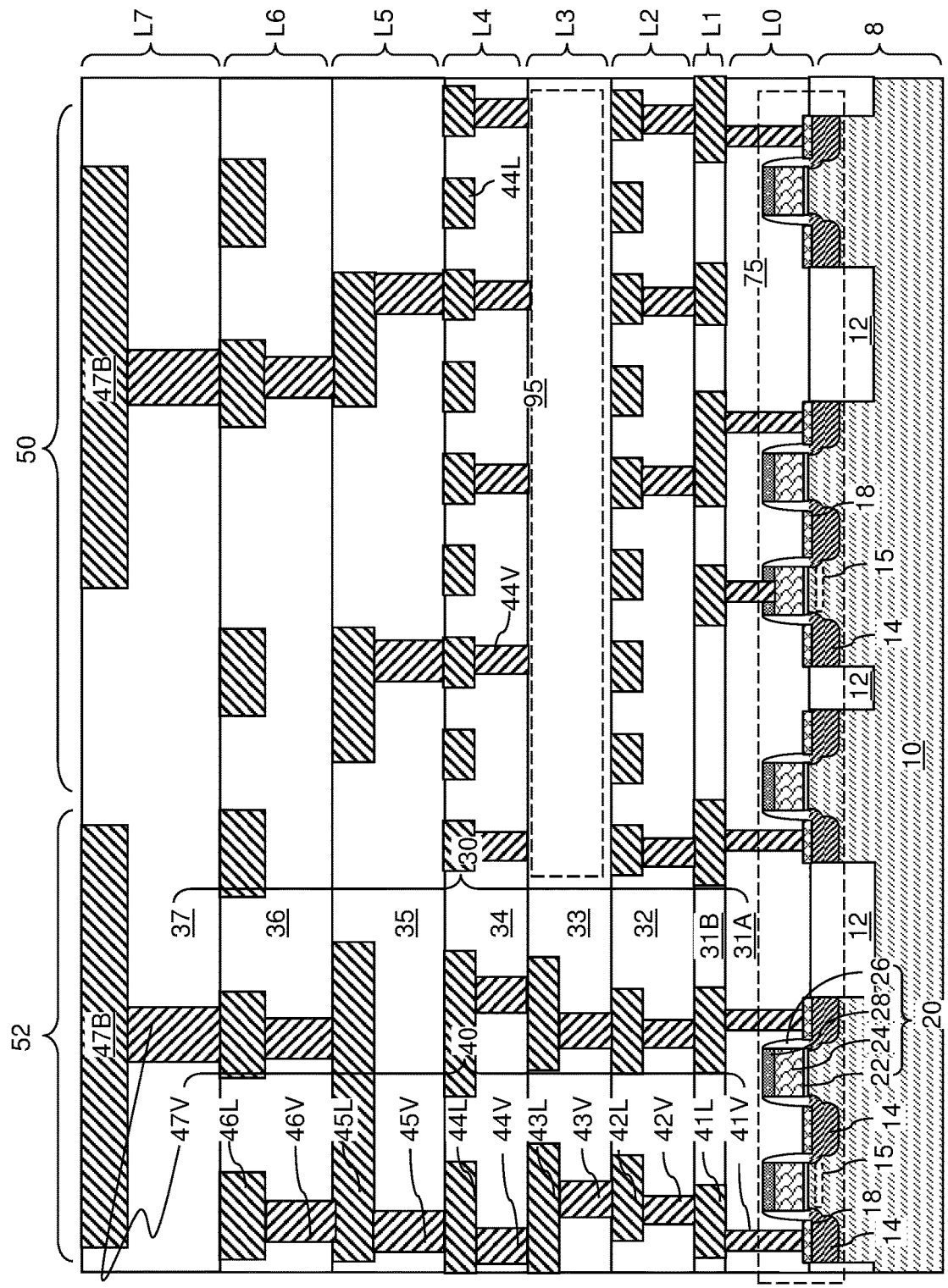
FIG. 1C is a vertical cross-sectional view of the first exemplary structure after formation of upper-level metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range. As used herein, the terms "substantially" and "about" refer to a variation of +/−5%.

The present disclosure is directed to semiconductor devices, and specifically to dual layered channel transistor devices and methods of forming the same.

Memory devices include a grid of independently functioning memory cells formed on a substrate. Memory devices may include volatile memory cells or nonvolatile (NV) memory cells. Emerging memory technologies seek to store more data at less cost than the expensive-to-build silicon chips used by popular consumer electronics. Such emerging memory devices may be used to replace existing memory technologies such as flash memory in near future. While existing resistive random-access memories have generally been adequate for their intended purposes, as device scaling-down continues, they have not been entirely satisfactory in all respects.

In some memory devices, CMOS transistors may be used as the selecting transistor. However, size limitation of the CMOS transistor technology may be the limiting factor in improving the size and memory cell density of memory devices. The various embodiments described herein provide improved transistors, for example, thin-film transistors (TFTs) which may be used as selecting transistors in various devices. The improved transistors of the various embodiments may include a dual layered channel, wherein the semiconductor materials used in the two channel layers may provide different resistances to improve channel mobility and to mitigate against parasitic resistance.

Referring to FIG. 1A, a first exemplary structure according to an embodiment of the present disclosure is illustrated prior to formation of an array of memory structures, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed.

For example, the at least one array of non-volatile memory cells may include resistive random-access memory (RRAM or ReRAM), magnetic/magneto-resistive random-access memory (MRAM), ferroelectric random-access memory (FeRAM), and phase-change memory (PCM) devices. The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a FEOL operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. In some embodiments, the active regions 14 may be epitaxially grown. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors to be subsequently formed.

Various interconnect-level structures may be subsequently formed, which may be formed prior to formation of an array of selector field effect transistors and are herein referred to as lower interconnect-level structures (L0, L1, L2). In embodiments in which a two-dimensional array of transistors may be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric layer 31B and first metal lines 41L formed within the first interconnect level dielectric layer 31B. The first interconnect level dielectric layer 31B is also referred to as a first line-level dielectric layer. The first metal lines 41L may contact a respective one of the contact via structures 41V. The second interconnect-level structure L2 includes a second interconnect level dielectric layer 32, which may include a stack of a first via-level dielectric material layer and a second line-level dielectric material layer or a line-and-via-level dielectric material layer. The second interconnect level dielectric layer 32 may have formed there within second interconnect-level metal interconnect structures (42V, 42L), which includes first metal via structures 42V and second metal lines 42L. Top surfaces of the second metal lines 42L may be coplanar with the top surface of the second interconnect level dielectric layer 32.

Referring to FIG. 1B, an array 95 of non-volatile memory cells and transistor selector devices may be formed in the memory array region 50 over the second interconnect-level structure L2. The details for the structure and the processing steps for the array 95 of non-volatile memory cells and transistor selector devices are subsequently described in detail below. A third interconnect level dielectric layer 33 may be formed during formation of the array 95 of non-volatile memory cells and transistor selector devices. The set of all structures formed at the level of the array 95 of non-volatile memory cells and transistor selector devices transistors is herein referred to as a third interconnect-level structure L3.

Referring to FIG. 1C, third interconnect-level metal interconnect structures (43V, 43L) may be formed in the third interconnect level dielectric layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect level dielectric layer 34 having formed therein fourth interconnect-level metal interconnect structures (44V, 44L), which may include third metal via structures 44V and fourth metal lines 44L. The fifth interconnect-level structure L5 may include a fifth interconnect level dielectric layer 35 having formed therein fifth interconnect-level metal interconnect structures (45V, 45L), which may include fourth metal via structures 45V and fifth metal lines 45L. The sixth interconnect-level structure L6 may include a sixth interconnect level dielectric layer 36 having formed therein sixth interconnect-level metal interconnect structures (46V, 46L), which may include fifth metal via structures 46V and sixth metal lines 46L. The seventh interconnect-level structure L7 may include a seventh interconnect level dielectric layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding) or may be configured for metal-to-metal bonding (such as copper-to-copper bonding).

Each interconnect level dielectric layer may be referred to as an interconnect level dielectric layer (ILD) layer 30. Each interconnect-level metal interconnect structure may be referred to as a metal interconnect structure 40. Each contiguous combination of a metal via structure and an overlying metal line located within a same interconnect-level structure (L2-L7) may be formed sequentially as two distinct structures by employing two single damascene processes or may be simultaneously formed as a unitary structure employing a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30 or may be incorporated into one or more of the ILD layers 30.

While the present disclosure is described employing an embodiment in which the array 95 of non-volatile memory cells and transistor selector devices may be formed as a component of a third interconnect-level structure L3, in some embodiments the array 95 of non-volatile memory cells and transistor selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and transistor selector devices may be provided within multiple interconnect-level structures in the memory array region 50. While the present disclosure is described employing an embodiment in which an array 95 of non-volatile memory cells and transistor selector devices may be formed in a single interconnect-level structure, in some embodiments an array 95 of non-volatile memory cells and transistor selector devices may be formed over two vertically adjoining interconnect-level structures. In addition, while various embodiments of the present disclosure are described below by illustrating the transistor selector devices as thin-film transistors (TFTs), other forms of transistor selector devices are contemplated and may be formed and used. For example, planar, gate-all-around, and fin transistors as well as other forms of transistors that benefit form a dual-layered channel may be formed and used as transistor devices.

Semiconductor transistor device include source and drain electrodes that contact a channel and overlap with a gate electrode that is separated from the channel by a gate insulating layer. However, such a configuration may result in a current flow path that extends through the bulk of the channel, thereby inducing channel length extension. In addition, parasitic resistance may occur where the source and/or drain electrodes contact the channel. Accordingly, transistor devices, such as TFTs, may have degraded channel mobility, due to increased channel resistance. As such, there is a need for transistors that provide for reduced channel resistance. Various embodiments are disclosed herein provide for dual-layered channel transistors that reduce channel resistance and improve channel mobility.

Figure 2A:
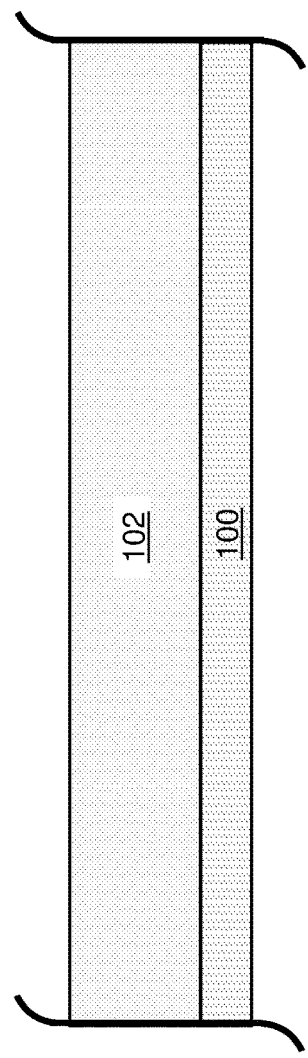
FIG. 2A is a vertical cross-sectional view illustrating an intermediate structure of an embodiment transistor after a dielectric is deposited over a substrate.

Referring to FIG. 2A, a first dielectric layer 102 may be deposited on a substrate 100. The substrate 100 may be any suitable substrate, such as a semiconductor substrate, and may include control elements formed during FEOL processes. The substrate 100 may further be an interconnect level dielectric layer such as second interconnect level dielectric layer 32. The first dielectric layer 102 may be formed of any suitable dielectric material such as silicon oxide ($SiO_2$), or the like, or high-k dielectric materials such as silicon nitride ($SiN_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$), or the like. Other suitable dielectric materials may also be within the contemplated scope of disclosure. The first dielectric layer 102 may be deposited using any suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Figure 2B:
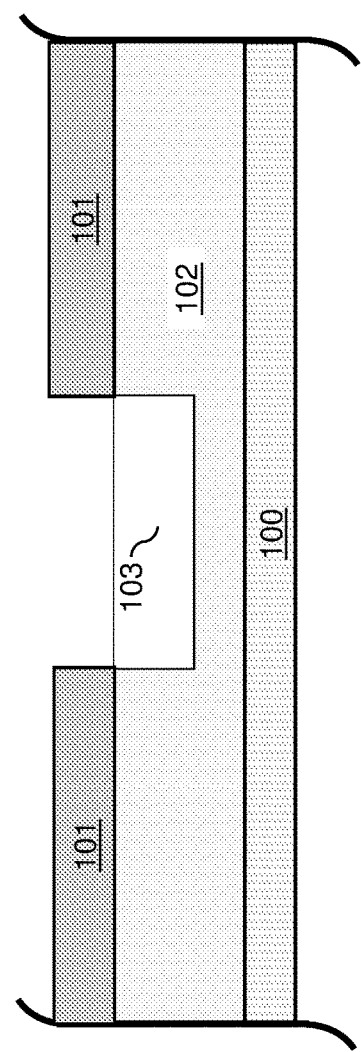
FIG. 2B is a vertical cross-sectional view illustrating an intermediate structure of an embodiment transistor after the formation of a word line trench in the dielectric deposited over the substrate.

Referring to FIG. 2B, a photoresist layer 101 may be applied over the first dielectric layer 102. The photoresist layer 101 may be lithographically patterned to form a line and space pattern that includes photoresist material strips that laterally extend along the first horizontal direction. An anisotropic etch process may be performed to etch unmasked portions of the first dielectric layer 102. Line trenches 103 laterally extending along the first horizontal direction may be formed in areas that are not masked by the photoresist material strips. The anisotropic etch process may use any suitable etching process, such as a wet or dry etching process. The photoresist layer 101 may be subsequently removed, for example, by ashing.

Figure 2C:
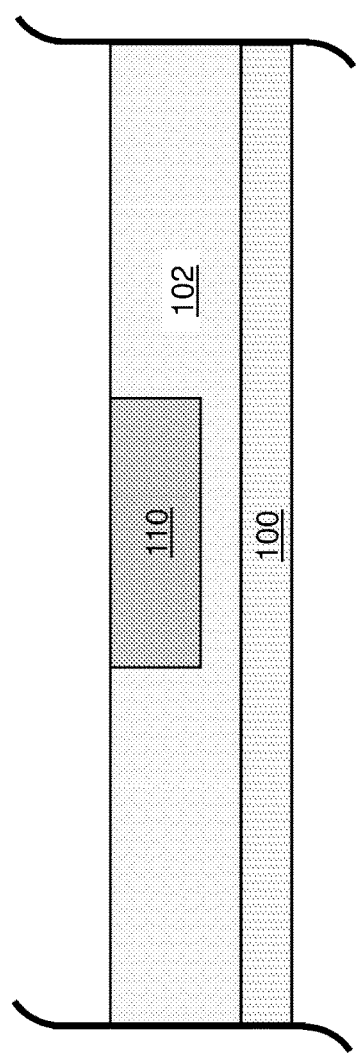
FIG. 2C is a vertical cross-sectional view illustrating an intermediate structure of an embodiment transistor after the deposition of metallic fill material in a word line trench to form a word line.

Referring to FIG. 2C, word lines 110 may be formed in the word line trenches 103. In particular, an electrically conductive material may be deposited over the first dielectric layer 102 and fill in word line trench 103. A planarization process, such as CMP, may then be performed to planarize upper surfaces of the first dielectric layer 102 and the word lines 110, and remove any excess electrically conductive material from the upper surface of the first dielectric layer 102. The word lines 110 may be formed of any suitable electrically conductive material, using any suitable deposition method as described herein. These suitable deposition methods may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like. The word lines 110 may be formed of any of copper, aluminum, zirconium, titanium, titanium nitride, tungsten, tantalum, tantalum nitride, ruthenium, palladium, platinum, cobalt, nickel, iridium, alloys thereof, or the like. Other suitable electrically conductive materials for formation of the word lines 110 may be within the contemplated scope of disclosure.

Referring to FIG. 2D, a gate dielectric layer 116 and a first channel material 120L may be deposited over the first dielectric layer 102 and the word lines 110. The gate dielectric material of the gate dielectric layer 116 may include a gate dielectric material such as silicon oxide, silicon oxynitride, a dielectric metal oxide, or a combination thereof. In some embodiments, the gate dielectric layer 116 may include a ferroelectric material, such as $PbZr/TiO_3$, $BaTiO^3$, $PbTiO_3$, or the like. However, other suitable dielectric materials are within the contemplated scope of disclosure. The thickness of the gate dielectric layer 116 may be in a range from 1 nm to 12 nm, such as from 2 nm to 6 nm, although lesser and greater thicknesses may also be used. Generally, gate dielectric layer 116 may be formed on first dielectric layer 102 and the word lines 110. The gate dielectric layer 116 may be formed by depositing a gate dielectric material on the first dielectric layer 102 and the word lines 110.

The first channel material 120L may be deposited using any suitable deposition process, as described herein. In various embodiments, the first channel material 120L may be formed of semiconductor materials, such as polysilicon, amorphous silicon, or a metal oxide semiconductor material, such as InGaZnO (IGZO), indium tin oxide (ITO), InWO, InZnO, InSnO, $GaO_x$, $InO_x$, or the like. The dopant level in the metal oxide semiconductor material may be selected such that leakage current through the metal oxide semiconductor material during device operation is negligible. For example, the dopant level in the metal oxide semiconductor material may be in a range from $1.0 \times 10^{10}/cm^3$ to $2.0 \times 10^{16}/cm^3$, although lesser and greater dopant concentrations may also be used.

The first channel material 120L may be deposited, for example, by chemical vapor deposition. The first channel material 120L may be deposited as a layer having a uniform thickness throughout, such as a thickness ranging from 2 nm to 60 nm, such as from 4 nm to 20 nm, although lesser and greater thicknesses may also be used.

Referring to FIG. 2E, a photoresist layer 101 may be applied over the first channel material 120L. The photoresist layer 101 may be lithographically patterned to form a line pattern that includes photoresist material strips that laterally extends along the first horizontal direction. An anisotropic etch process may be performed to etch unmasked portions of the first channel material 120L. A first channel layer 120 extending along the first horizontal direction may be formed by etching away the unmasked portions of the first channel material 120L. An anisotropic etch process may be performed on the first channel material 120L selective to the underlying gate dielectric layer 116. The anisotropic etch process may use any suitable etching process, such as a wet or dry etching process. The photoresist layer 101 may be subsequently removed, for example, by ashing.

Figure 2F:
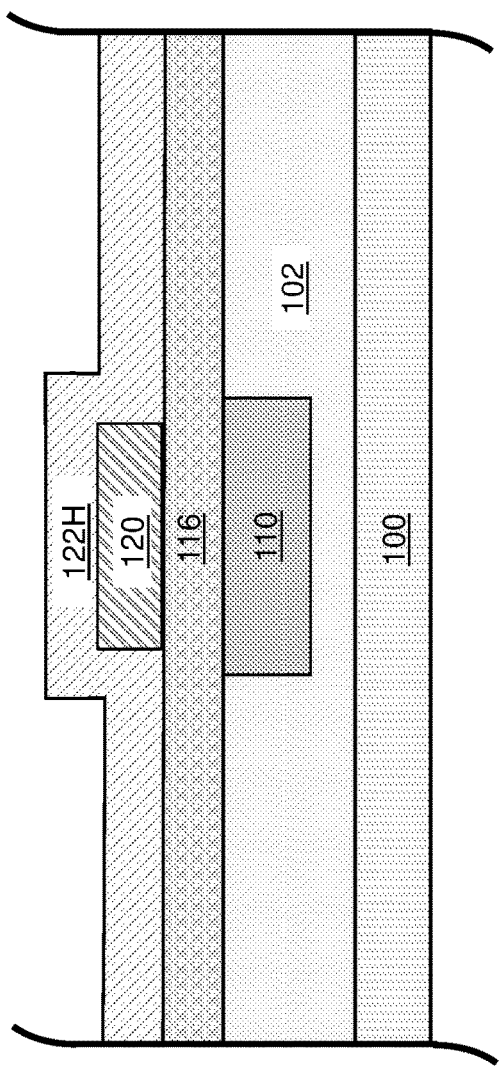
FIG. 2F is a vertical cross-sectional view illustrating an intermediate structure of an embodiment transistor after depositing a second channel material over the first channel layer and gate dielectric layer.

Referring to FIG. 2F, a second channel material 122H may be conformally deposited on the first channel layer 120 and the gate insulating layer 116. In various embodiments, the second channel material 122H may be formed of semiconductor materials, such as polysilicon, amorphous silicon, or semiconducting oxides, such as InGaZnO (IGZO), indium tin oxide (ITO), InWO, InZnO, InSnO, $GaO_x$, $InO_x$, or the like. However, the first and second channel materials 120L, 122H may be formed of respective semiconductor materials having different electrical resistances (e.g., different "on" resistances), band gaps, and/or threshold voltages.

In particular, the second channel material 122H may include any suitable semiconductor material, so long as the second channel material 122H has a higher electrical resistance, band gap, and/or threshold voltage than the material of the first channel layer 120 (i.e., the first channel material 120L). The second channel material 122H may directly contact top and side surfaces of the first channel layer 120.

Figure 2G:
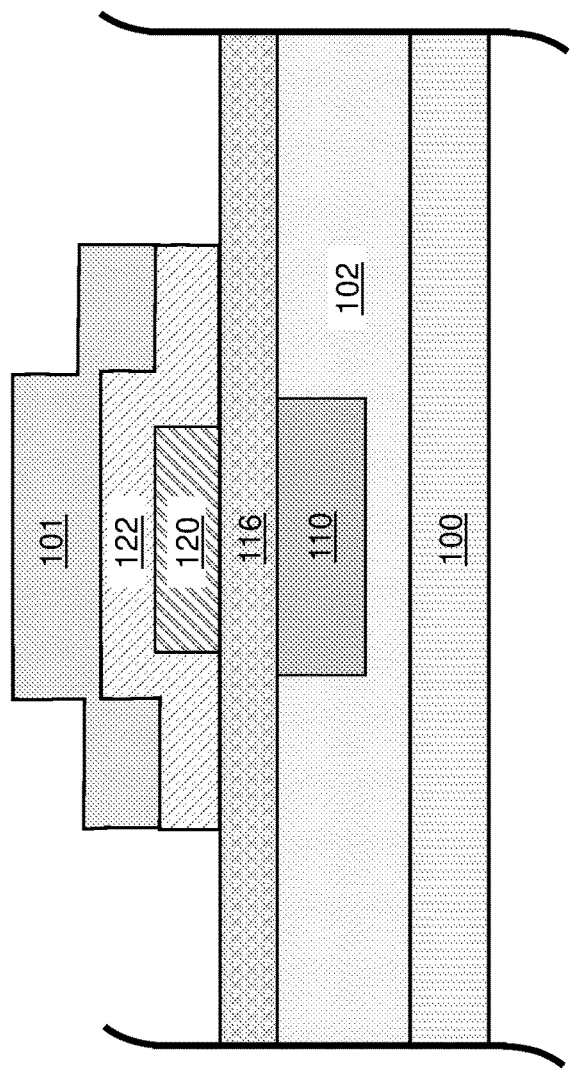
FIG. 2G is a vertical cross-sectional view illustrating an intermediate structure of an embodiment transistor after the patterning of the second channel material to form a second channel layer.

Referring to FIG. 2G, the second channel material 122H may be patterned to form a second channel layer 122. In particular, a patterned photoresist layer 101 may be formed on the second channel material 122H, and the second channel material 122H may be etched using the photoresist layer 101 as a mask, using any suitable etching process, such as a wet or dry etching process, to form the second channel layer 122.

In some embodiments, the etching process may optionally include etching portions of the gate insulating layer 116. In particular, portions of the gate insulating layer 116 that are not overlapped with the second channel layer 122 may optionally be removed during the etching process.

In various embodiments, the first and second channel layers 120, 122 may have different electrical resistances. For example, in some embodiments, the first channel layer 120 may have a lower electrical resistance than the second channel layer 122. The first channel layer 120 may be formed of a semiconductor material (e.g., semiconductor material 120L) having a lower electrical resistance, band gap, and/or threshold voltage than a semiconductor material (e.g., semiconductor material 122L) of the second channel layer 122. In other words, the first channel layer 120 may have a lower electrical resistance than the second channel layer 122, when a voltage is applied to the word line 110. For example, the first channel layer 120 may be formed of poly-Si, InO, ITO, $SnO_2$, or a first type of IGZO, and the second channel layer 122 may be formed of $Ga_2O_3$, GZO, or second type of IGZO. The first type of IGZO may have a lower Ga at % or a higher In at % than the second type of IGZO. In some embodiments, the sheet resistance of the first channel layer 120 may range from $1e^3$ Ω/square to $1e^4$ Ω/square, and the sheet resistance of the second channel layer 122 may range from $4e^3$ Ω/square to $2e^4$ Ω/square. The sheet resistance is related to channel mobility.

Figure 2H:
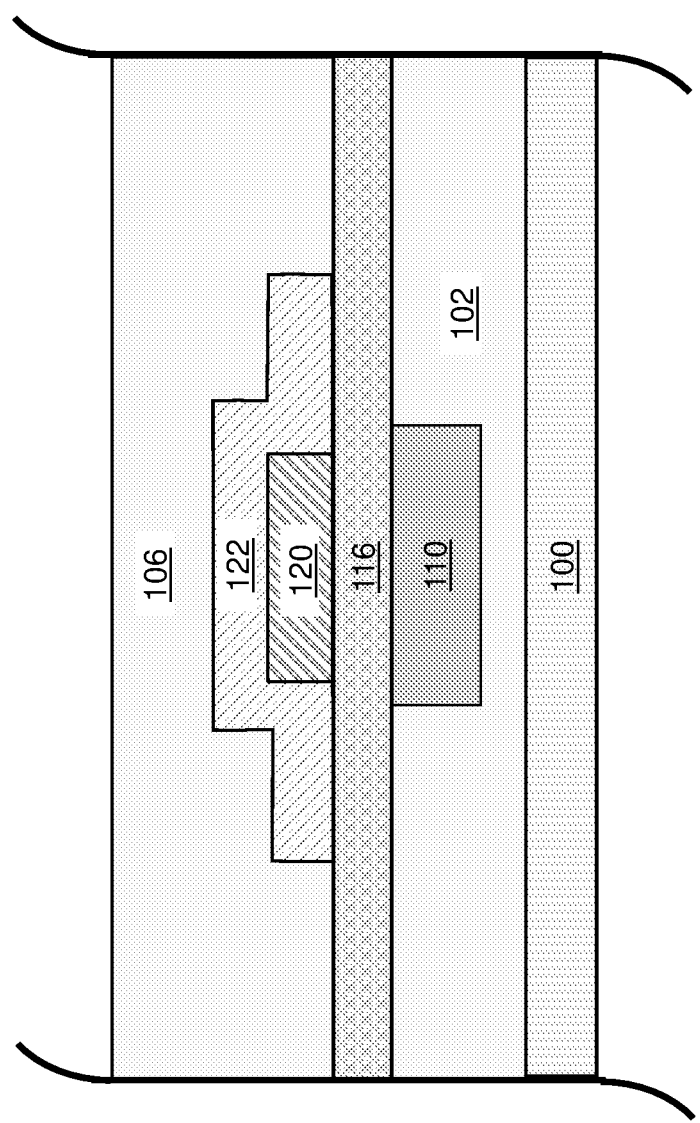
FIG. 2H is a vertical cross-sectional view illustrating an intermediate structure of an embodiment transistor after the deposition of a second dielectric layer over the second channel layer and the gate dielectric layer.

Referring to FIG. 2H, a second dielectric layer 106 may be deposited on the second channel layer 122 and the gate insulating layer 116. In particular, the photoresist layer 101 may be removed, for example, by ashing, and the second dielectric layer 106 may be formed by depositing any suitable dielectric material, using any suitable deposition process, as described herein.

Figure 2I:
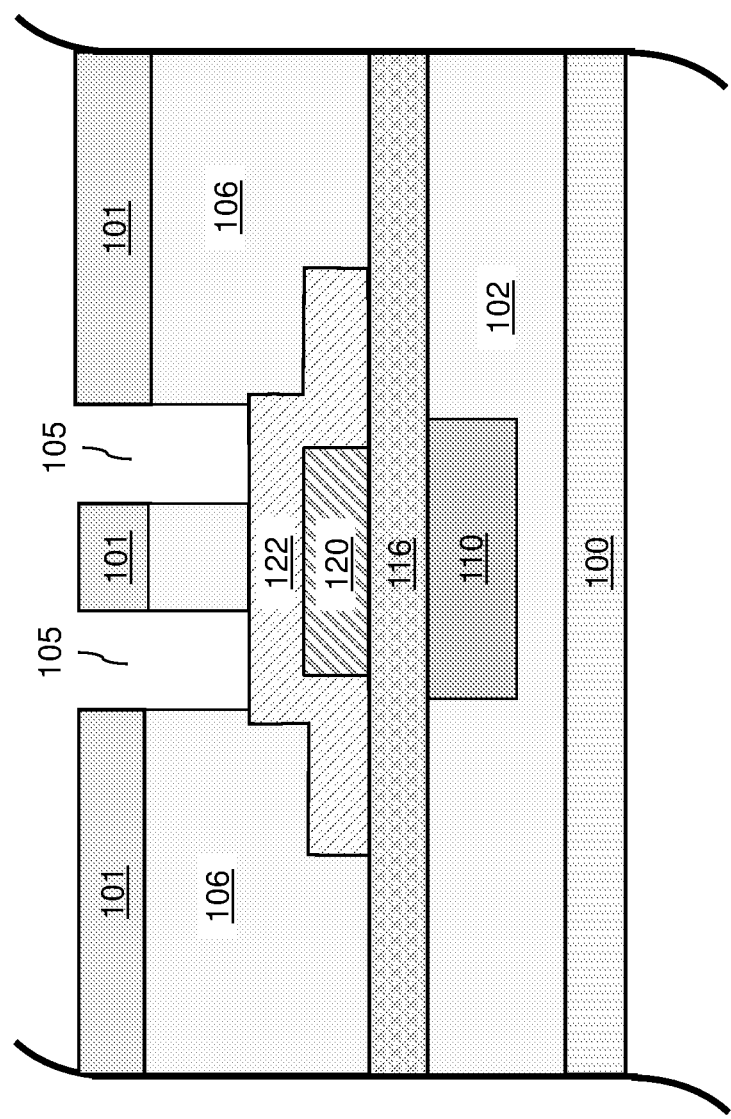
FIG. 2I is a vertical cross-sectional view illustrating an intermediate structure of an embodiment transistor after the forming of active region electrode via cavities in the second dielectric layer.

Referring to FIG. 2I, a photoresist layer 101 may be applied over the second dielectric layer 106. The photoresist layer 101 may be lithographically patterned to form two openings in the photo resist layer 101. An anisotropic etching process may be used to form active region electrode via cavities 105 in the second dielectric layer 106 and expose the top surface of second channel layer 122 at the bottom of each active region electrode via cavity 105. The anisotropic etch may use any suitable etching process, such as a wet or dry etching process, to form the active region electrode via cavities 105. The photoresist layer 101 may subsequently be removed, for example, by ashing.

Figure 2J:
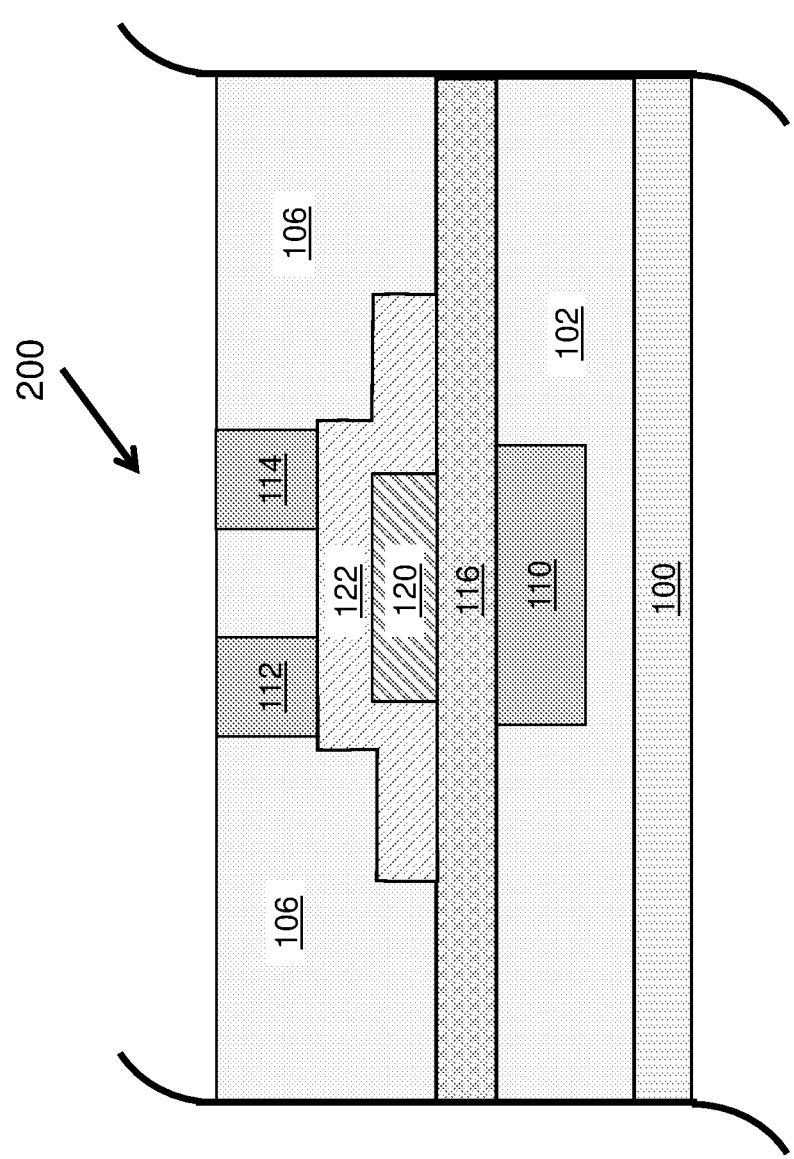
FIG. 2J is a vertical cross-sectional view illustrating an embodiment transistor after the forming of active region electrodes in active region electrode via cavities.

Referring to FIG. 2J, active region (source and drain) electrodes 112, 114 may be formed in the active region electrode via cavities 105. In particular, an electrically conductive material may be deposited on the second dielectric layer 106 and in the active region electrode via cavities 105. A planarization process may then be performed, such as CMP, in order to planarize the upper surfaces of the source electrode 112 and drain electrode 114, and the second dielectric layer 106 to remove excess metallic fill material and to form a co-planar top surface of the source electrode 112 and drain electrode 114 as well as the second dielectric layer 106. A dual-layered channel transistor 200 may be formed upon the completion of the source electrode 112 and drain electrode 114.

FIG. 3A is a top plan view with partially transparent layers of a dual-layered channel transistor 300, according to various embodiments of the present disclosure. The partially transparent layers illustrate the positioning of particular elements relative to one another in an embodiment dual-layered channel transistor 300. FIG. 3B is a corresponding vertical cross-sectional view taken along line A-A' of FIG. 3A. Referring to FIGS. 3A and 3B, the dual-layered channel transistor 300 may be formed on a semiconductor substrate 100 during back-end-of-line (BEOL) processing. In particular, the dual-layered channel transistor 300 may be included in an interconnect structure of a semiconductor device, as shown in FIGS. 1A-1C. The embodiment transistor comprises a dual layered channel 125 that comprises a buried first channel layer 120. In particular, at least a portion of the first channel layer 120 may be embedded in the second channel layer 122. The first channel layer 120 may be formed of a semiconductor or electrically conductive material that has a lower resistance than second channel layer 122, when a voltage is applied to the word line 110. For example, the first channel layer 120 may comprise poly-Si, InO, ITO, $SnO_2$, or a first type of IGZO, and the second channel layer 122 may comprise $Ga_2O_3$, GZO, or second type of IGZO. The first type of IGZO may have a lower Ga at % or a higher In at % than the second type of IGZO. In some embodiments, the sheet resistance of the first channel layer 120 may range from $1e^3$ Ω/square to $1e^4$ Ω/square. For example, the first channel layer 120 may be electrically conductive and comprise a metal such as copper, aluminum, gold, silver, platinum, alloys thereof, or the like. The sheet resistance of the second channel layer 122 may range from $4e^3$ Ω/square to $2e^4$ Ω/square. The sheet resistance is related to channel mobility.

A source electrode 112 and a drain electrode 114 may be disposed on the dual layered channel 125. In particular, the source electrode 112 may be electrically coupled to a source region of the dual-layered channel 125, and the drain electrode 114 may be electrically coupled to a drain region of the dual-layered channel 125. The source electrode 112 and drain electrode 114 may be formed of any suitable electrically conductive material, as described herein.

The word line 110 may have a width G that is greater than a width W of the first channel layer 120. Accordingly, the first channel layer 120 may be completely overlapped with the word line 110, in a vertical direction (e.g., a direction perpendicular to a plane of the substrate 100). The portion of the word line 110 that is overlapped with the dual-layered channel 125 may operate as a gate electrode of the transistor 300.

The source electrode 112 and drain electrode 114 may be separated from one another by a channel width C. The channel width C may be less than the width G of the word line 110, such that the source electrode 112 and drain electrode 114 overlap opposing portions of the word line 110. In some embodiments, the channel width C may be less than the width W of the first channel layer 120. As such, the source electrode 112 and drain electrode 114 may vertically overlap opposing portions of the first channel layer 120 and opposing portions of the word line 110. However, in some embodiments, the channel width C may be greater than the width W of the first channel layer 120 and may be less than the width G of the word line 110. As such, the source electrode 112 and drain electrode 114 may vertically overlap only with opposing portions of the word line 110.

In operation, when a gate voltage is applied to the word line 110, current may flow through the dual-layered channel 125, from the source electrode 112 to the drain electrode 114. In particular, as current passes through the dual-layered channel 125, at least some of the current may preferentially flow through the first channel layer 120, due to the first channel layer 120 having a lower resistance than the second channel layer 122. In other words, current may flow from the source electrode 112, into a first region 122S (e.g., source region) of the second channel layer 122, through the width W of the first channel layer 120, and into a second region 122D (e.g., drain region) of the second channel layer 122, before flowing into the drain electrode 114, as shown by the dashed arrow of FIG. 3B.

Accordingly, the first channel layer 120 may be configured to reduce the total channel resistance of transistor 200, since the first channel layer 120 provides a lower resistance path for current flow, as compared to the second channel layer 122. In addition, since the current flows through a source region section 122S of the second channel layer 122 and a drain region 122D section of the second channel layer 122, before entering and after exiting the first channel layer 120, the source region 122S, and drain region 122D of the second channel layer 122 may operate as current control regions, since the threshold voltage of the second channel layer 122 may be higher than the threshold voltage of the first channel layer 120. Thus, the total resistance ($R_{total}$) of the effective channel may be the various resistances in series represented by: $R_{total} = R_{channel\_source\_112} + (R_{second\ channel\ source\ region\ 122S} + R_{first\ channel\ layer\ 120} + R_{second\ channel\ drain\ region\ 122D}) + R_{channel\_drain\ 114}$. The total resistance may be reduced by including the lower resistance material of the first channel layer 120. The threshold voltage $V_{th}$ may be defined by the energy gap ($E_g$) of the second channel layer 122 material that has the higher energy gap as compared to the energy gap of the first channel layer 120 material.

In another embodiment and with reference to FIGS. 4A-4G, a dual-layered channel transistor 400 may be formed using the same process steps as illustrated in FIGS. 2A-2J. As noted above, in the dual-layered channel transistor 300, the second channel layer 122 may be formed with a material having a higher resistance than the material used to form first channel layer 120. However, with reference to dual-layered channel transistor 400 illustrated in FIG. 5B, unlike the dual-layered channel 125 of the dual-layered channel transistor 300, the first channel layer 120 of the dual-layered channel 125A may have a higher electrical resistance, band gap, and/or threshold voltage than the second channel layer 122. For example, in the dual-layered channel transistor 400, the first channel layer 120 and second channel layer 122 may be formed of semiconductor materials, such that the first channel layer 120 has a higher electrical resistance, band gap, and/or threshold voltage than the second channel layer 122.

In some embodiments, the second channel layer 122 may be formed of a semiconductor material, while the first channel layer 120 may be formed of resistive material having a higher electrical resistance than the semiconductor material of the second channel layer 122, when a voltage is applied to the word line 110.

Figure 4A:
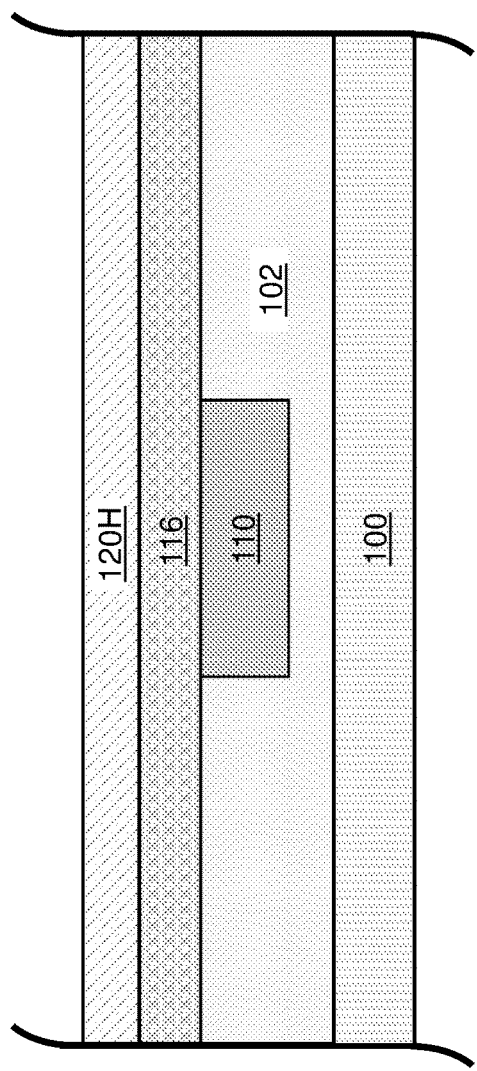
FIG. 4A is a vertical cross-sectional view illustrating an intermediate structure of a transistor according to another embodiment after the deposition of gate dielectric layer and a first channel material over the word line and first dielectric layer.

FIGS. 4A-4G are vertical cross-sectional views showing various steps for manufacturing a dual-layered channel transistor 400, according to various embodiments of the present disclosure. Referring to FIG. 4A, a gate dielectric layer 116 and a first channel material 120H may be deposited over the first dielectric layer 102 and the word lines 110 of an intermediate structure as shown in FIG. 2C. The gate dielectric material of the gate dielectric layer 116 may include a gate dielectric material such as silicon oxide, silicon oxynitride, a dielectric metal oxide, or a combination thereof. Other suitable dielectric materials are within the contemplated scope of disclosure. The thickness of the gate dielectric layer 116 may be in a range from 1 nm to 12 nm, such as from 2 nm to 6 nm, although lesser and greater thicknesses may also be used. Generally, gate dielectric layer 116 may be formed on first dielectric layer 102 and the word lines 110. The gate dielectric layer 116 may be formed by depositing a gate dielectric material on the first dielectric layer 102 and the word lines 110.

The first channel material 120H may be deposited using any suitable deposition process, as described herein. In various embodiments, the first channel material 120H may be formed of semiconductor materials, such as polysilicon, amorphous silicon, or a metal oxide semiconductor material, such as InGaZnO (IGZO), indium tin oxide (ITO), InWO, InZnO, InSnO, $GaO_x$, $InO_x$, or the like. The dopant level in the metal oxide semiconductor material may be selected such that leakage current through the metal oxide semiconductor material during device operation is negligible. For example, the dopant level in the metal oxide semiconductor material may be in a range from $1.0 \times 10^{10}/cm^3$ to $2.0 \times 10^{16}/cm^3$, although lesser and greater dopant concentrations may also be used.

The first channel material 120H may be deposited, for example, by chemical vapor deposition. The first channel material 120H may be a layer having a uniform thickness throughout, such as a thickness ranging from 2 nm to 60 nm, such as from 4 nm to 20 nm, although lesser and greater thicknesses may also be used.

Figure 4B:
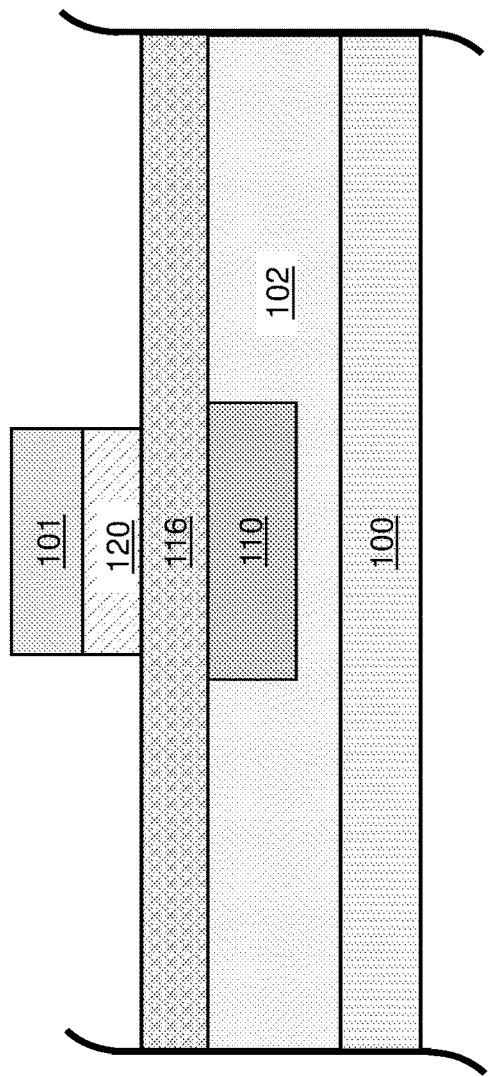
FIG. 4B is a vertical cross-sectional view illustrating an intermediate structure of a transistor according to another embodiment after the patterning of the first channel material to form a first channel layer.

Referring to FIG. 4B, a photoresist layer 101 may be applied over the first channel material 120H. The photoresist layer 101 may be lithographically patterned to form a line pattern that includes photoresist material strips that laterally extends along the first horizontal direction. An anisotropic etch process may be performed to etch unmasked portions of the first channel material 120H. A channel layer 120 extending along the first horizontal direction may be formed by etching away the unmasked portions of the first channel material 120H. An anisotropic etch process may be performed on the first channel material 120H selective to the underlying gate dielectric layer 116. The anisotropic etch process may use any suitable etching process, such as a wet or dry etching process. The photoresist layer 101 may be subsequently removed, for example, by ashing.

Figure 4C:
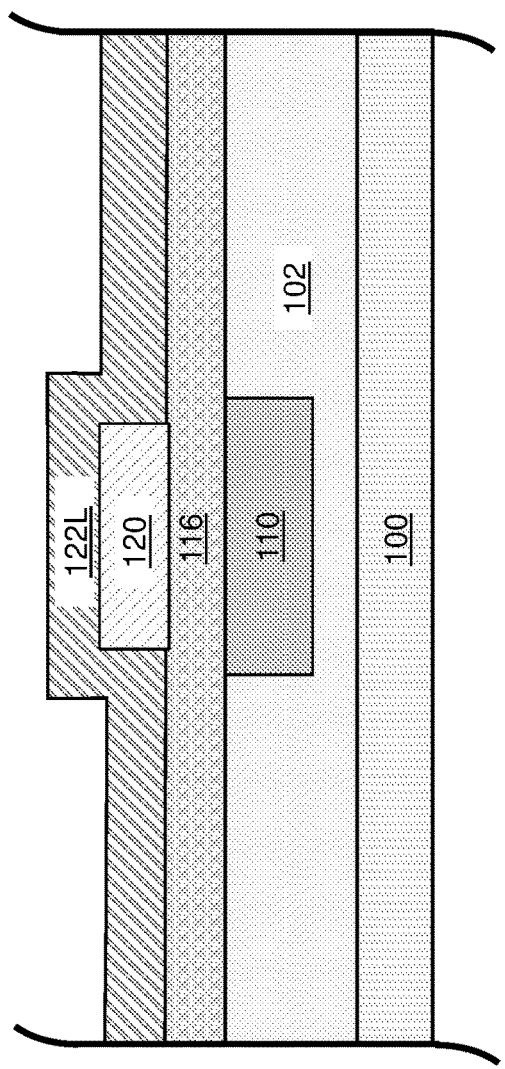
FIG. 4C is a vertical cross-sectional view illustrating an intermediate structure of a transistor according to another embodiment after depositing a second channel material over the first channel layer and gate dielectric layer.

Referring to FIG. 4C, a second channel material 122L may be conformally deposited on the first channel layer 120 and the gate insulating layer 116. In various embodiments, the second channel material 122L may be formed of semiconductor materials, such as polysilicon, amorphous silicon, or semiconducting oxides, such as InGaZnO (IGZO), indium tin oxide (ITO), InWO, InZnO, InSnO, GaOx, InOx, or the like. However, the first and second channel materials 120H, 122L may be formed of respective semiconductor materials having different electrical resistances (e.g., different "on" resistances), band gaps, and/or threshold voltages.

In particular, the second channel material 122L may be deposited using any suitable deposition method and any suitable semiconductor material, so long as the second channel material 122L has a lower electrical resistance, band gap, and/or threshold voltage than the material of the first channel layer 120 (i.e., the first channel material 120H). The second channel material 122L may directly contact top and side surfaces of the first channel layer 120.

In various embodiments, the first and second channel materials 120H, 122L may have different electrical resistances, band gaps, and/or threshold voltages. For example, in some embodiments, the first channel material 120H may have a higher electrical resistance than the second channel material 122L.

Figure 4D:
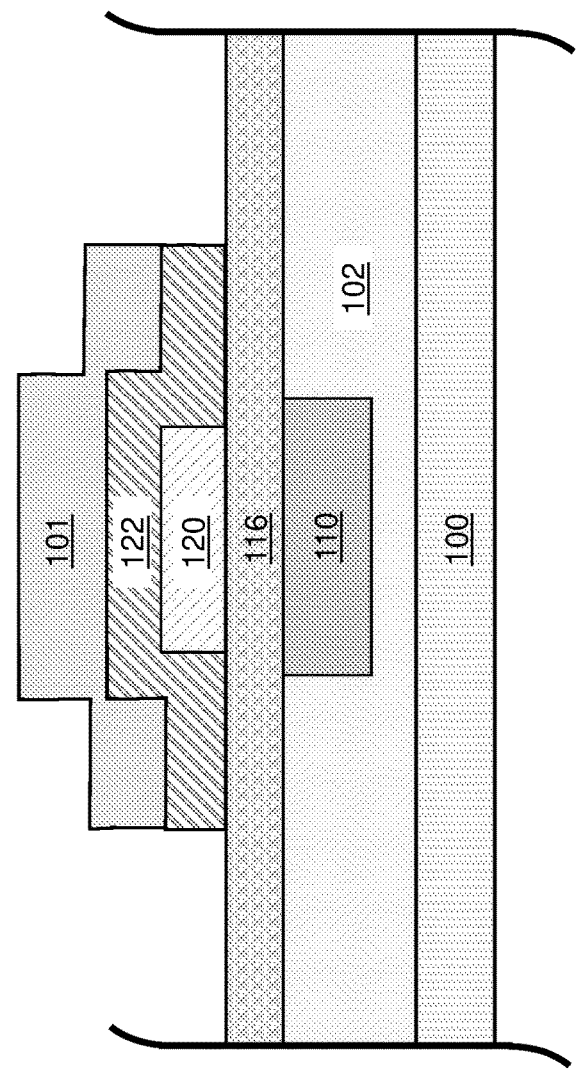
FIG. 4D is a vertical cross-sectional view illustrating an intermediate structure of a transistor according to another embodiment after the patterning of the second channel material to form a second channel layer.

Referring to FIG. 4D, the second channel material 122L may be patterned to form a second channel layer 122. In particular, a patterned photoresist layer 101 may be formed on the second channel material 122L, and the second channel material 122L may be etched using the photoresist layer 101 as a mask, using any suitable etching process, such as a wet or dry etching process, to form the second channel layer 122.

In some embodiments, the etching process may optionally include etching portions of the gate insulating layer 116. In particular, portions of the gate insulating layer 116 that are not overlapped with the second channel layer 122 may optionally be removed during the etching process.

The first channel layer 120 may have a higher electrical resistance than the second channel layer 122, when a voltage is applied to the word line 110. For example, the first channel layer 120 may comprise amorphous silicon, $Ga_2O_3$, GZO, or a second type of IGZO, and the second channel layer 122 may comprise poly-Si, InO, ITO, $SnO_2$, or a first type of IGZO, wherein the second type of IGZO has a higher Ga at % or a lower In at % than the first type of IGZO. In some embodiments, the sheet resistance of the first channel layer 120 may range from $4e^3$ Ω/square to $2e^4$ Ω/square and the sheet resistance of the second channel layer 122 may range from $1e^3$ Ω/square to $1e^4$ Ω/square.

Figure 4E:
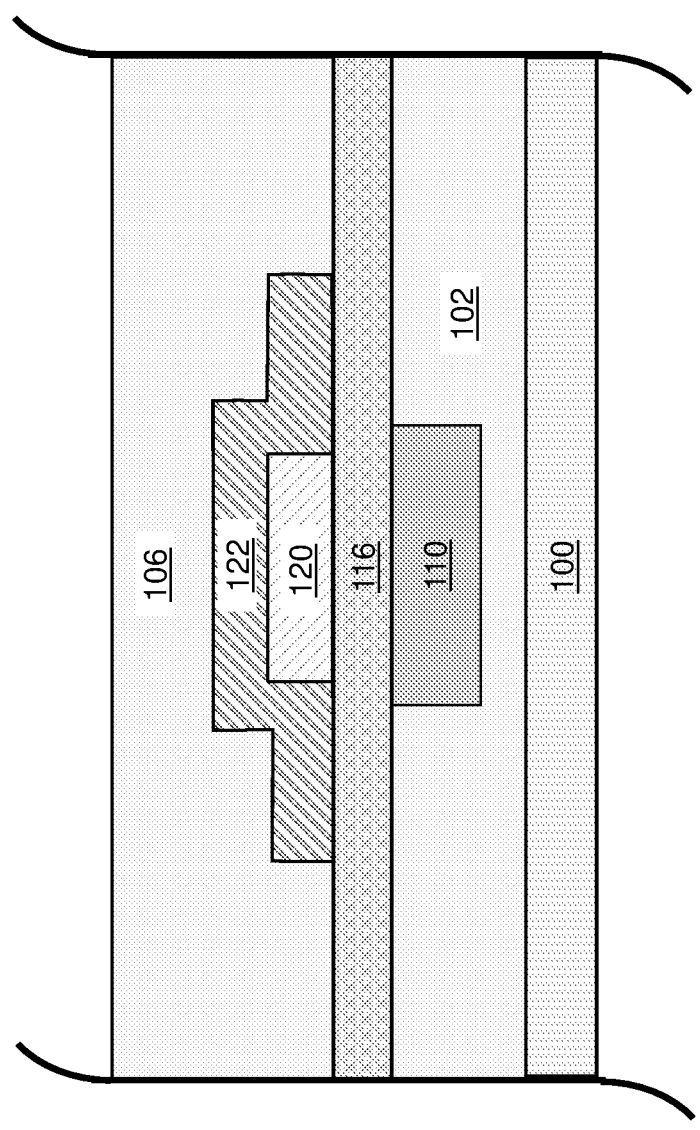
FIG. 4E is a vertical cross-sectional view illustrating an intermediate structure of a transistor according to another embodiment after the deposition of a second dielectric layer over the second channel layer and the gate dielectric layer.

Referring to FIG. 4E, a second dielectric layer 106 may be deposited on the second channel layer 122 and the gate insulating layer 116. In particular, the photoresist layer 101 may be removed, for example, by ashing, and the second dielectric layer 106 may be formed by depositing any suitable dielectric material, using any suitable deposition process, as described herein.

Figure 4F:
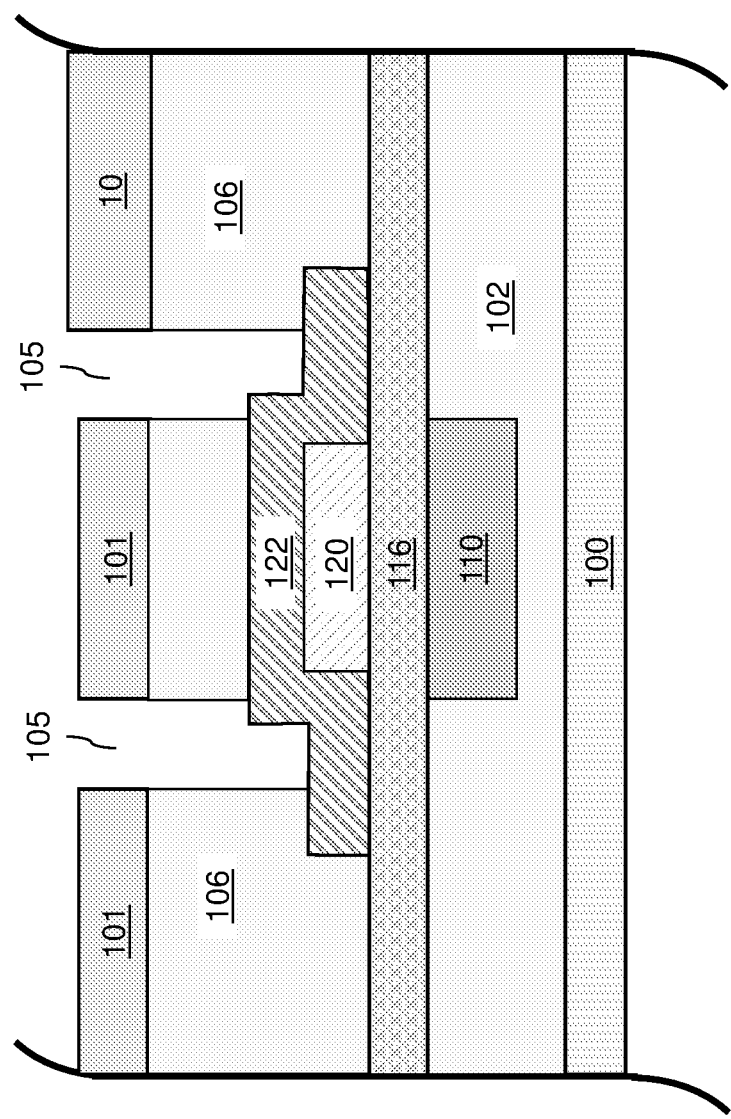
FIG. 4F is a vertical cross-sectional view illustrating an intermediate structure of a transistor according to another embodiment after the forming of active region electrode via cavities in the second dielectric layer.

Referring to FIG. 4F, a photoresist layer 101 may be applied over the second dielectric layer 106. The photoresist layer 101 may be lithographically patterned to form two openings in the photoresist layer 101. An anisotropic etching process may be used to etch the second dielectric layer 106 to form active region electrode via cavities 105 in the second dielectric layer 106 and expose a top surface of second channel layer 122 at the bottom of each active region electrode via cavity 105. The anisotropic etch may use any suitable etching process, such as a wet or dry etching process, to form the active region electrode via cavities 105. The photoresist layer 101 may subsequently be removed, for example, by ashing.

Figure 4G:
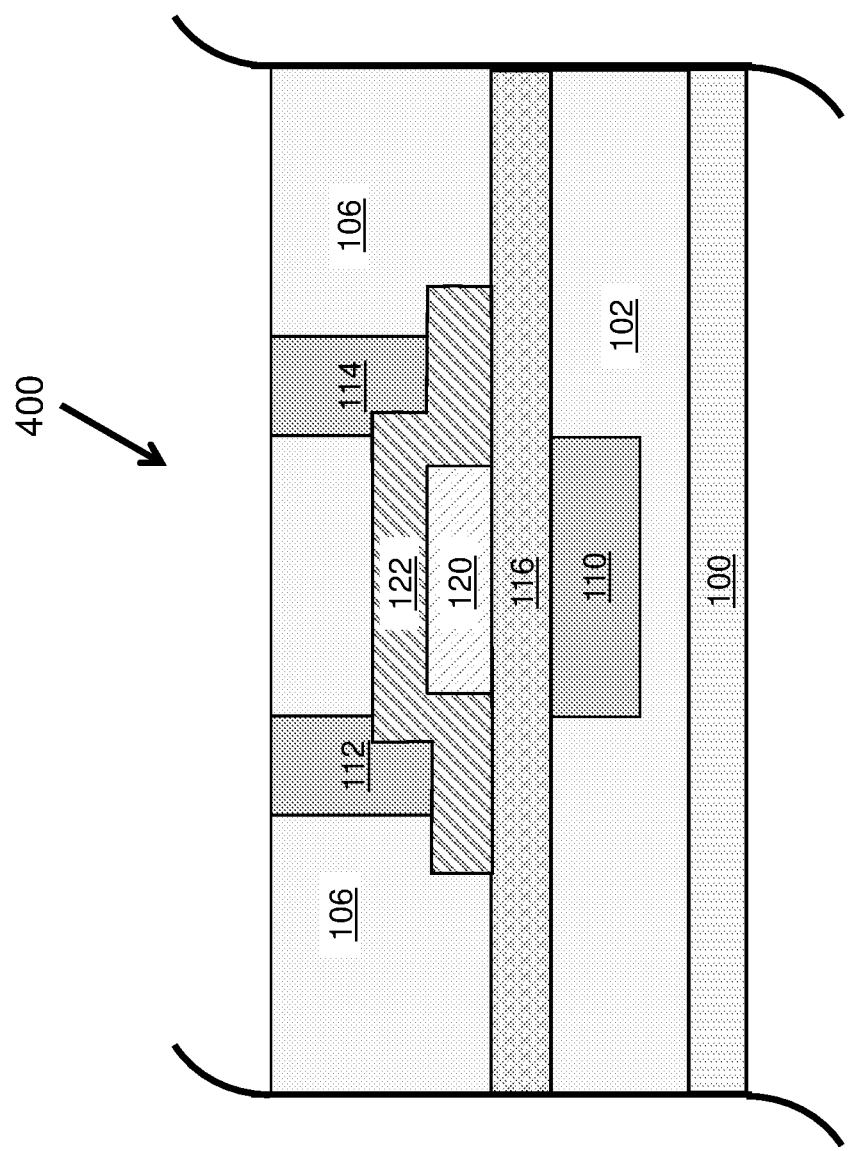
FIG. 4G is a vertical cross-sectional view illustrating a transistor according to another embodiment after the forming of active region electrodes in active region electrode via cavities.

Referring to FIG. 4G, active region (source and drain) electrodes 112, 114 may be formed in the active region electrode via cavities 105. In particular, an electrically conductive material may be deposited on the second dielectric layer 106 and in the active region electrode via cavities 105. A planarization process may then be performed, such as CMP, in order to planarize the upper surfaces of the source electrode 112 and drain electrode 114, as well as the second dielectric layer 106 to remove excess metallic fill material and to form a co-planar top surface of the source electrode 112, drain electrode 114 and the second dielectric layer 106. A dual-layered channel transistor 400 may be formed upon the completion of the source electrode 112 and drain electrode 114.

Figure 5B:
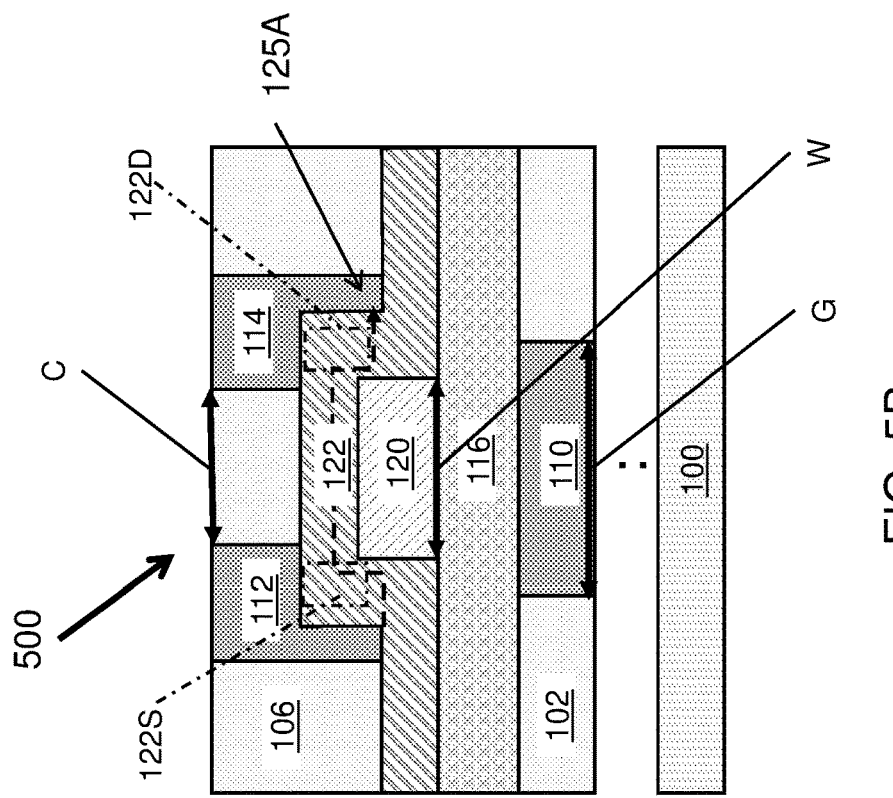
FIG. 5B is a vertical cross-sectional view of a transistor taken along line A-A' of FIG. 5A according to various embodiments of the present disclosure.
Figure 5A:
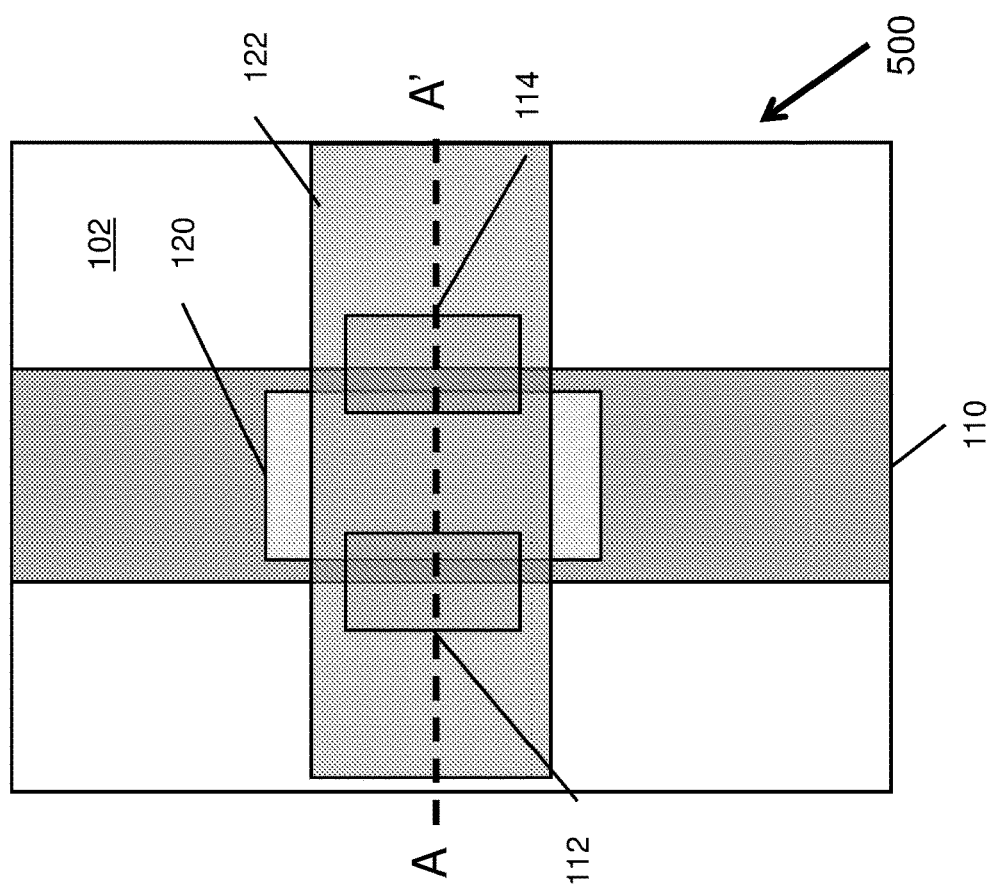
FIG. 5A is top semi-transparent view of a transistor 500, according to various embodiments of the present disclosure.

FIG. 5A is a top semi-transparent plan view of a dual-layered channel transistor 500, according to various embodiments of the present disclosure. FIG. 5B is a vertical cross-sectional view taken along line A-A' of FIG. 5A. Referring to FIGS. 5A and 5B, the dual-layered channel transistor 500 may include a dual-layer channel 125A disposed between the gate insulating layer 116, the source electrode 112 and drain electrode 114. The dual-layered channel 125A may include a first channel layer 120 and a second channel layer 122 covering top and side surfaces of the first channel layer 120.

A channel width C, taken between the source electrode 112 and drain electrode 114, may be less than a width W of the first channel layer 120. The width W of the first channel layer 120 may be less than a width G of the word line 110. The source electrode 112 and drain electrode 114 may vertically overlap with opposing portions of the word line 110. In some embodiments, the source and drain electrodes 112, 114 may also vertically overlap with opposing portion first channel layer 120.

During operation of the dual-layered channel transistor 500, when a voltage is applied to the word line 110, a portion of the word line 110 disposed below the dual-layered channel 125A may operate as a gate electrode. In particular, current may flow from the source electrode 112, into a source region 122S of the second channel layer 122, across a portion of the second channel layer 122 disposed above the first channel layer 120, and into a drain region 122D of the second channel layer 122, before entering the drain electrode 114, as shown by the dashed arrow. Current may flow preferentially through the second channel layer 122 as opposed as through first channel layer 120, due to the relatively higher electrical resistance of the first channel layer 120 as compared to second channel layer 122. In other words, the first channel layer 120 may be configured to shorten a current flow path through the dual-layered channel 125A, since current is directed away from the bulk of the dual-layered channel 125A by the first channel layer 120. Due to the lower resistance of the second channel 122, more current may flows through the second channel 122 than the first channel 120, as shown by the dashed line shown. This also can be explained by the Ec band offset. For example, the electron affinity of the second channel 122 is greater than the electron affinity of the first channel 120, which indicates that charge may be easily accumulated in the second channel 122. Under this situation, the current tends to flow through the second channel 122 first, before flowing through the first channel 120, as the gate voltage is increased. Hence, the resistance of the dual-layered channel 125A may be reduced. The buried first channel layer 120 may enhance carrier mobility to reduce a scattering effect.

FIG. 6A is a top semi-transparent plan view of a dual-layered channel transistor 600, according to another embodiment of the present disclosure. FIG. 6B is a vertical cross-sectional view taken along line A-A' of FIG. 6A. The dual-layered channel transistor 600 may be similar to the dual-layered channel transistor 300 illustrated in FIGS. 3A and 3B. As such, only the differences there between will be discussed in detail, and like reference numbers refer to like elements.

Referring to FIGS. 6A and 6B, a channel width C between the source electrode 112 and drain electrode 114 of the dual-layered channel transistor 600 may be larger than the channel width C of the dual-layered channel transistor 300. In other words, the channel width C may be larger than the width G of the word line 110. As such, the source electrode 112 and drain electrode 114 may not vertically overlap with the word line 110 or the first channel layer 120. Within a portion of the dual-layered channel 125 above the word line 110, current flow may be controlled by the gate voltage applied to the word line 110, and the source electrode 112 and drain electrode 114 are not directly overlapped with the word line 110. Therefore, the parasitic capacitance in the dual-layered channel 125 adjacent to the source electrode 112 and drain electrode 114 may be reduced.

FIG. 7A is a top plan view of a dual-layered channel transistor 700, according to another embodiment of the present disclosure. FIG. 7B is a vertical cross-sectional view taken along line A-A' of FIG. 7A. The dual-layered channel transistor 700 may be similar to the dual-layered channel transistors 400, 500 illustrated in FIGS. 4A-5B. As such, only the difference there between will be discussed in detail, and like reference numbers refer to like elements.

Referring to FIGS. 7A and 7B, a channel width C between the source electrode 112 and drain electrode 114 of the dual-layered channel transistor 700 may be larger than the channel width of the dual-layered channel transistors 400, 500 illustrated in FIGS. 4A-5B. In other words, the channel width C may be larger than the width G of the word line 110. As such, the source electrode 112 and drain electrode 114 may not vertically overlap with the word line 110 or the first channel layer 120.

Figure 8:
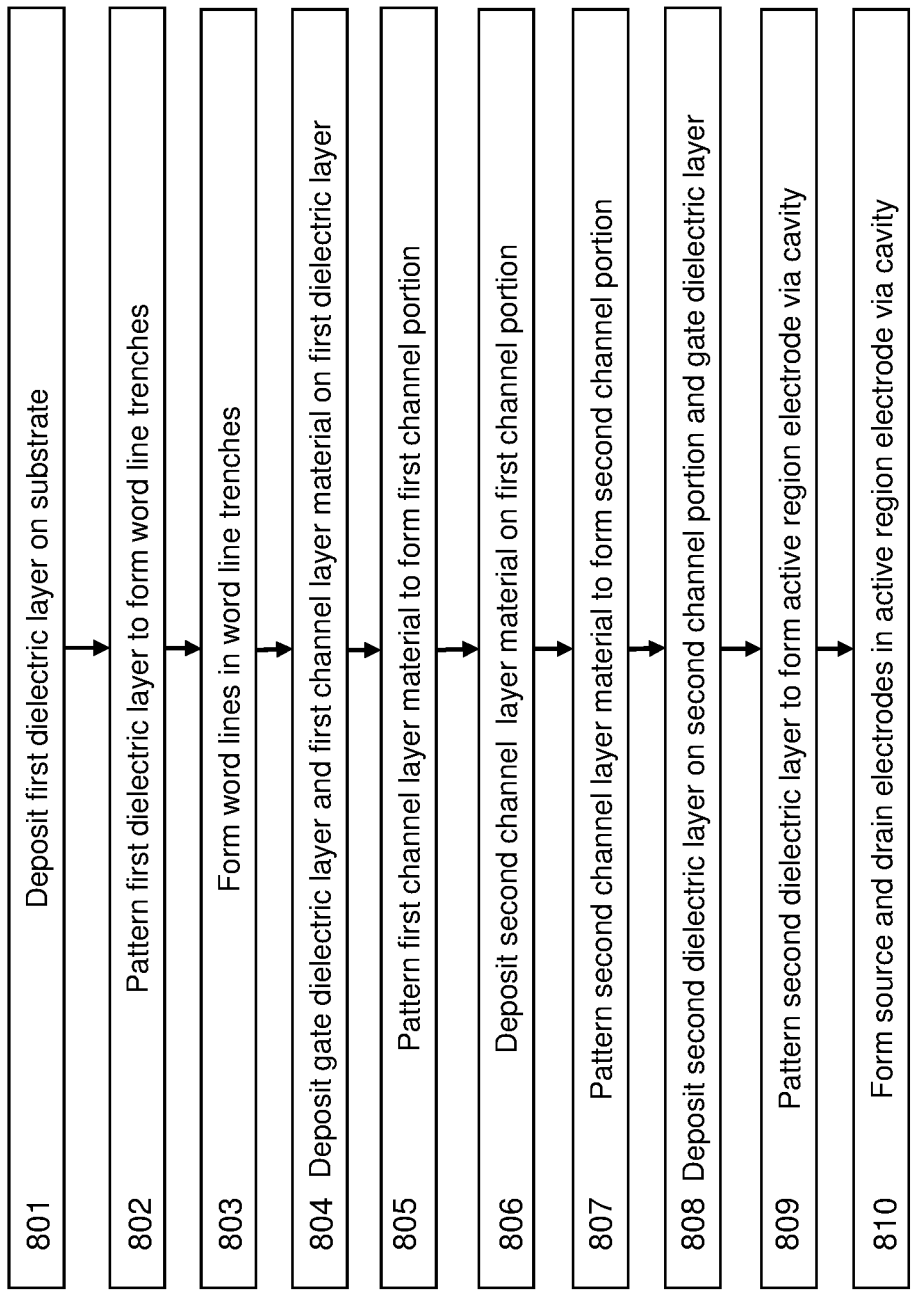
FIG. 8 is a flow diagram of a method of forming a dual-layered channel transistor, according to various embodiments of the present disclosure.

FIG. 8 is a flow diagram of a method of forming a dual-layered channel transistors 200, 300, 400, 500, 600 and 700, according to various embodiments of the present disclosure. With reference to FIG. 8 and FIGS. 2A-7B, in operation 801, a first dielectric layer 102 may be deposited over a substrate 100. In operation 802, the first dielectric layer 102 may be patterned to form word line trenches 103. In operation 803, a metallic fill material may be deposited over the first dielectric layer 102 and in the word line trenches 103 to form word line 110. The first dielectric layer 102 and word line 110 may be planarized such that the top surface of the first dielectric layer 102 and the word line are co-planar. In operation 804, a gate dielectric layer 116 and first channel layer 120 (L/H) material may be sequentially deposited over the first dielectric layer 102 and word lines 110. In operation 805, the first channel layer 120 (L/H) material may be patterned to form a first channel layer 120.

In operation 806, a second channel layer 122 (H/L) material may be deposited over the first channel layer 120 and gate dielectric layer 116.

In embodiments to form dual-layered channel transistors 200, 300, and 600, the second channel material 122H has a higher electrical resistance, band gap, and/or threshold voltage than the first channel material 120L. In embodiments to form dual-layered channel transistors 400, 500, and 700, the second channel material 122L has a lower electrical resistance, band gap, and/or threshold voltage than the first channel material 120H. In operation 807, the second channel layer 122 (H/L) may be patterned to form a second channel layer 122. In operation 808, a second dielectric layer 106 may be deposited over the second channel layer 122 and gate dielectric layer 116. In operation 809, the second dielectric layer 106 may be patterned to form active region electrode via cavities 105. In operation 810, a metallic fill material may be deposited over the second dielectric layer 106 and in the active region electrode via cavities 105 to form source electrode 112 and drain electrode 114. The second dielectric layer 106 and source and drain electrodes 112, 114 may be planarized such that the top surface of the second dielectric layer 102, the source electrode 112 and the drain electrode 114 are co-planar.

In various embodiments, operations 809 and 810 may be modified such that of the active region electrode via cavities 105 may be disposed further apart, such that the source electrode 112 and drain electrode 114 are separated by a channel width C that is greater than the width W of the word lines 110, in order to form the dual-layered channel transistors 600 and 700 of FIGS. 6A, 6B and 7A, 7B.

According to various embodiments, provided are transistors that include a dual-layer channel including a low resistance channel layer and a high resistance channel layer. The dual-layer channel may be configured to reduce the overall channel resistance of a dual-layered channel transistor, by reducing the resistance of at least a portion of the dual-layer channel and/or by reducing the length of a current flow path through the dual-layer channel.

Various embodiments provide a dual-layered channel transistors 200, 300, 400, 500, 600, 700 that includes a substrate 100; a word line 110 disposed on the substrate 100; a gate dielectric layer 116 disposed on the word line 110; a dual-layer semiconductor channel 125 that includes a first channel layer 120 having a first electrical resistance and disposed on the gate dielectric layer 116; a second channel layer 122 having a second electrical resistance that is different from the first electrical resistance and disposed on the first channel layer 120, such that the second channel layer 122 contacts side and top surfaces of the first channel layer 120; and a source electrode 112 and drain electrode 114 that are electrically coupled to the second channel layer 122.

Various embodiments provide method of forming a dual-layered channel transistors 200, 300, 400, 500, 600, 700 wherein the method includes the operations of depositing a first dielectric layer 102 on a semiconductor substrate 100; forming a word line 110 in the first dielectric layer 102; depositing a gate dielectric layer 116 over the word line 110; forming a dual-layer channel 125 on the gate dielectric layer 116 by: depositing a first channel layer 120L having a first electrical resistance on the gate dielectric layer 116; and depositing a second channel layer 122 having a second electrical resistance that is different from the first electrical resistance on the first channel layer 120, such that the second channel layer 122 contacts side and top surfaces of the first channel layer 120. The embodiment method further comprising the operations of depositing second dielectric layer 106 on the second channel layer 122; and forming a source electrode 112 and a drain electrode 114 in the second dielectric layer 106.

The foregoing outlines features of several embodiments so that those skilled in the art may better understand the aspects of the present disclosure. Those skilled in the art would appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
a gate electrode;
a gate dielectric layer disposed on the gate electrode;
a first channel layer disposed on the gate dielectric layer and having a first electrical resistance;
a second channel layer covering top and side surfaces of the first channel layer; and
a source electrode and a drain electrode that are electrically coupled to the second channel layer,
wherein the first channel layer has a higher electrical resistance than the second channel layer, such that when a voltage is applied to the gate electrode more current flows through the second channel layer than through the first channel layer.

2. The transistor of claim 1, wherein:
the first channel layer comprises amorphous-Si, $Ga_2O_3$, GZO, or a second type of IGZO;
the second channel layer comprises poly-Si, InO, ITO, $SnO_2$, or a first type of IGZO; and
wherein the first type of IGZO has a lower Ga at % or a higher In at % than the second type of IGZO.

3. The transistor of claim 1, wherein the first channel layer has a higher band gap than the second channel layer.

4. The transistor of claim 1, wherein the first channel layer has a different threshold voltage from the second channel layer.

5. The transistor of claim 1, wherein a width of the first channel layer is less than a width of the gate electrode.

6. The transistor of claim 5, wherein the source electrode and drain electrode overlap opposing portions of the gate electrode, in a vertical direction.

7. The transistor of claim 1, wherein the source electrode and drain electrode overlap opposing portions of the first channel layer in a vertical direction.

8. The transistor of claim 7, wherein a channel width taken between the source electrode and drain electrode is less than a width of the gate electrode.

9. The transistor of claim 1, further comprising a first dielectric layer disposed on the substrate, wherein the gate electrode is embedded in the first dielectric layer.

10. The transistor of claim 9, further comprising a second dielectric layer disposed on the second channel layer, wherein the source electrode and the drain electrode are embedded in the second dielectric layer.

11. A transistor, comprising:
a gate electrode;
a gate dielectric layer disposed on the gate electrode;
a first channel layer disposed on the gate dielectric layer and comprising a first an amorphous-Si, $Ga_2O_3$, or GZO semiconductor material;
a second channel layer covering top and side surfaces of the first channel layer and comprising a poly-Si, InO, ITO, or $SnO_2$ semiconductor material; and
a source electrode and a drain electrode that are electrically coupled to the second channel layer.

12. The transistor of claim 11, wherein the first channel layer is configured to reduce a total resistance of an effective channel of the transistor by shortening the length of a conductive path through the dual-layer channel.

13. The transistor of claim 11, wherein
the first semiconductor material has a higher bandgap than the second semiconductor material.

14. The transistor of claim 11, wherein the source electrode and drain electrode overlap opposing portions of the gate electrode and opposing portions of the first channel layer in a vertical direction.

15. The transistor of claim 11, wherein a channel width taken between the source electrode and drain electrode is less than a width of the gate electrode.

16. A transistor, comprising:
a gate electrode;
a gate dielectric layer disposed on the gate electrode;
a first channel layer disposed on the gate dielectric layer and comprising a second type of IGZO;
a second channel layer disposed on top and side surfaces of the first channel layer and comprising a first type of IGZO; and
a source electrode and a drain electrode that are electrically coupled to the second channel layer,
wherein the first type of IGZO has a lower Ga at % or a higher In at % than the second type of IGZO.

17. The transistor of claim 16, wherein a width of the gate electrode is greater that a width of the first channel layer.

18. The transistor of claim 16, wherein a channel width taken between the source electrode and drain electrode is less than a width of the gate electrode.

19. The transistor of claim 16, wherein the first channel layer is configured to reduce a total resistance of an effective channel of the transistor by shortening the length of a conductive path through the dual-layer channel.

20. The transistor of claim 16, wherein the first channel layer has a higher electrical resistance than the second channel layer.

* * * * *